(12) United States Patent
Lysejko et al.

(10) Patent No.: US 10,098,018 B2
(45) Date of Patent: Oct. 9, 2018

(54) CONFIGURABLE ANTENNA AND METHOD OF OPERATING SUCH A CONFIGURABLE ANTENNA

(71) Applicant: Airspan Networks Inc., Boca Raton, FL (US)

(72) Inventors: Martin Lysejko, Bagshot (GB); Stuart Parrott, Woodstock (GB)

(73) Assignee: Airspan Networks Inc., Boca Raton, FL (US)

( * ) Notice: Subject to any disclaimer, the term of this patent is extended or adjusted under 35 U.S.C. 154(b) by 75 days.

(21) Appl. No.: 15/187,680

(22) Filed: Jun. 20, 2016

(65) Prior Publication Data

US 2016/0380355 A1 Dec. 29, 2016

(30) Foreign Application Priority Data

Jun. 25, 2015 (GB) .................................. 1511200.6
Oct. 30, 2015 (GB) .................................. 1519220.6

(51) Int. Cl.
*H01Q 21/00* (2006.01)
*H04W 24/02* (2009.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
CPC .......... H01Q 3/36; H01Q 21/24; H04W 16/28
(Continued)

(56) References Cited

U.S. PATENT DOCUMENTS 497,147 A 5/1893 Urich
3,789,415 A 1/1974 Vickland
(Continued)

FOREIGN PATENT DOCUMENTS

CN 1284794 A 2/2001
CN 104635203 A 5/2015
(Continued)

OTHER PUBLICATIONS

PCT Search Report from PCT/GB2016/051195, dated Jul. 25, 2016, 13 pgs.
(Continued)

*Primary Examiner* — Huedung Mancuso
(74) *Attorney, Agent, or Firm* — Haynes Beffel & Wolfeld LLP

(57) ABSTRACT

Antenna apparatus and a method of operating the antenna apparatus are provided. The antenna apparatus comprises a directional antenna comprising antenna array components, RF chains connected to the antenna array components, and a transceiver connected to the RF chains. Each RF chain comprises in sequence: a switching stage having switching circuitry selectively to connect an antenna array component, a phase shifting stage having phase shifting circuitry, and a summation stage having summation circuitry, wherein at least two of the RF chains share phase shifting circuitry and at least two of the RF chains share summation circuitry. The at least partial sharing of the RF chains, an in particular of the phase shifting circuitry provides a compact and cheap antenna apparatus, which is nonetheless capable of degree of configurability in direction and beam pattern to enable it to operate in a busy and changing environment.

22 Claims, 16 Drawing Sheets

(51) Int. Cl.
| | |
|---|---|
| H04W 4/50 | (2018.01) |
| F16M 11/06 | (2006.01) |
| G01S 3/04 | (2006.01) |
| G01S 3/14 | (2006.01) |
| G01S 5/02 | (2010.01) |
| G01S 19/24 | (2010.01) |
| G01S 19/53 | (2010.01) |
| H01Q 1/02 | (2006.01) |
| H01Q 1/12 | (2006.01) |
| H01Q 1/24 | (2006.01) |
| H01Q 1/36 | (2006.01) |
| H01Q 1/42 | (2006.01) |
| H01Q 1/50 | (2006.01) |
| H01Q 3/02 | (2006.01) |
| H01Q 3/04 | (2006.01) |
| H01Q 3/10 | (2006.01) |
| H01Q 3/12 | (2006.01) |
| H01Q 3/24 | (2006.01) |
| H01Q 3/26 | (2006.01) |
| H01Q 3/36 | (2006.01) |
| H01Q 21/06 | (2006.01) |
| H01Q 21/08 | (2006.01) |
| H01Q 21/20 | (2006.01) |
| H01Q 21/24 | (2006.01) |
| H01Q 21/28 | (2006.01) |
| H01Q 25/00 | (2006.01) |
| H04B 7/0456 | (2017.01) |
| H04B 7/06 | (2006.01) |
| H04L 12/24 | (2006.01) |
| H04L 12/26 | (2006.01) |
| H04L 29/08 | (2006.01) |
| H04W 16/28 | (2009.01) |
| H04W 24/08 | (2009.01) |
| H04W 24/10 | (2009.01) |
| H04W 28/02 | (2009.01) |
| H04W 28/24 | (2009.01) |
| H04W 40/22 | (2009.01) |
| H04W 48/06 | (2009.01) |
| H04W 72/04 | (2009.01) |
| H04W 72/08 | (2009.01) |
| H04W 88/04 | (2009.01) |
| H05K 7/20 | (2006.01) |
| H04B 7/08 | (2006.01) |
| H04W 84/02 | (2009.01) |
| H04W 84/04 | (2009.01) |
| H04W 88/08 | (2009.01) |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/50* (2018.02); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H04B 7/0817* (2013.01); *H04W 84/02* (2013.01); *H04W 84/045* (2013.01); *H04W 88/08* (2013.01)

(58) Field of Classification Search
USPC .......................................................... 343/853
See application file for complete search history.

(56) References Cited

U.S. PATENT DOCUMENTS

| | | |
|---|---|---|
| 3,844,341 A | 10/1974 | Bimshas, Jr. et al. |
| 4,436,190 A | 3/1984 | Wentzell |
| 4,599,620 A | 7/1986 | Evans |
| 4,633,256 A | 12/1986 | Chadwick |
| 4,959,653 A | 9/1990 | Ganz |
| 5,049,891 A | 9/1991 | Ettinger et al. |
| 5,125,008 A | 6/1992 | Trawick et al. |
| 5,357,259 A | 10/1994 | Nosal |
| 6,124,832 A | 9/2000 | Jeon et al. |
| 6,404,385 B1 | 6/2002 | Croq et al. |
| 6,486,832 B1 | 11/2002 | Abramov et al. |
| 6,522,898 B1 | 2/2003 | Kohno et al. |
| 6,621,454 B1 | 9/2003 | Reudink et al. |
| 6,934,511 B1 | 8/2005 | Lovinggood et al. |
| 6,963,747 B1 | 11/2005 | Elliott |
| 7,062,294 B1 * | 6/2006 | Rogard ................ H04B 7/0615 342/367 |
| 7,403,748 B1 * | 7/2008 | Keskitalo ................ H04B 7/06 455/101 |
| 7,515,916 B1 | 4/2009 | Alexander |
| 7,593,693 B1 | 9/2009 | Kasapi et al. |
| 7,664,534 B1 | 2/2010 | Johnson |
| 7,697,626 B2 * | 4/2010 | Wang ................ H04B 7/0695 375/267 |
| 8,509,724 B2 * | 8/2013 | D'Amico ............ H04B 7/0874 455/273 |
| 8,577,416 B2 | 11/2013 | Nandagopalan et al. |
| 8,630,267 B1 | 1/2014 | Jin |
| 9,692,124 B2 | 6/2017 | Caimi et al. |
| 9,698,891 B2 * | 7/2017 | Larsson ................ H04B 7/0671 |
| 9,706,419 B2 | 7/2017 | Bozier et al. |
| 2002/0042274 A1 | 4/2002 | Ades |
| 2002/0142779 A1 | 10/2002 | Goto et al. |
| 2003/0195017 A1 | 10/2003 | Chen et al. |
| 2003/0228857 A1 | 12/2003 | Maeki |
| 2004/0077354 A1 | 4/2004 | Jason et al. |
| 2004/0106436 A1 | 6/2004 | Ochi et al. |
| 2004/0233103 A1 | 11/2004 | Toshev |
| 2004/0242274 A1 | 12/2004 | Corbett et al. |
| 2005/0048921 A1 | 3/2005 | Chung |
| 2005/0063340 A1 | 3/2005 | Hoffmann et al. |
| 2005/0157684 A1 | 7/2005 | Ylitalo et al. |
| 2005/0192037 A1 | 9/2005 | Nanda et al. |
| 2005/0285784 A1 | 12/2005 | Chiang et al. |
| 2006/0072518 A1 | 4/2006 | Pan et al. |
| 2006/0292991 A1 | 12/2006 | Abramov et al. |
| 2008/0005121 A1 | 1/2008 | Lam et al. |
| 2008/0123589 A1 | 5/2008 | Lee et al. |
| 2009/0005121 A1 | 1/2009 | Wong et al. |

(56) References Cited

U.S. PATENT DOCUMENTS

| | | | |
|---|---|---|---|
| 2009/0032223 A1 | 2/2009 | Zimmerman et al. | |
| 2009/0046638 A1* | 2/2009 | Rappaport | H04B 7/0413 370/329 |
| 2009/0067333 A1 | 3/2009 | Ergen et al. | |
| 2009/0103492 A1 | 4/2009 | Altshuller et al. | |
| 2009/0116444 A1 | 5/2009 | Wang et al. | |
| 2009/0207077 A1 | 8/2009 | Hwang et al. | |
| 2009/0252088 A1 | 10/2009 | Rao et al. | |
| 2009/0274076 A1 | 11/2009 | Muharemovic et al. | |
| 2009/0310554 A1 | 12/2009 | Sun et al. | |
| 2010/0071049 A1 | 3/2010 | Bahr et al. | |
| 2010/0130150 A1* | 5/2010 | D'Amico | H04B 7/0874 455/226.1 |
| 2010/0216477 A1 | 8/2010 | Ryan | |
| 2010/0240380 A1 | 9/2010 | Yim et al. | |
| 2011/0003554 A1 | 1/2011 | Sekiya | |
| 2011/0163905 A1 | 7/2011 | Denis et al. | |
| 2011/0235569 A1 | 9/2011 | Huang et al. | |
| 2011/0244808 A1 | 10/2011 | Shiotsuki et al. | |
| 2011/0312269 A1* | 12/2011 | Judd | G01S 19/25 455/11.1 |
| 2012/0002598 A1 | 1/2012 | Seo et al. | |
| 2012/0119951 A1 | 5/2012 | Vollath | |
| 2012/0329511 A1 | 12/2012 | Keisu | |
| 2013/0203401 A1 | 8/2013 | Ryan et al. | |
| 2013/0215844 A1 | 8/2013 | Seol et al. | |
| 2014/0256376 A1 | 9/2014 | Weissman et al. | |
| 2014/0313080 A1 | 10/2014 | Smith et al. | |
| 2015/0078191 A1 | 3/2015 | Jongren et al. | |
| 2016/0037550 A1 | 2/2016 | Barabell et al. | |
| 2016/0255667 A1 | 9/2016 | Schwartz | |
| 2016/0277087 A1 | 9/2016 | Jo et al. | |
| 2016/0377695 A1 | 12/2016 | Lysejko et al. | |
| 2016/0380353 A1 | 12/2016 | Lysejko et al. | |
| 2016/0380354 A1 | 12/2016 | Bozier et al. | |
| 2016/0380363 A1 | 12/2016 | Logothetis | |
| 2016/0381570 A1 | 12/2016 | Lysejko et al. | |
| 2016/0381574 A1 | 12/2016 | Dudzinski et al. | |
| 2016/0381585 A1 | 12/2016 | Dudzinski et al. | |
| 2016/0381590 A1 | 12/2016 | Lysejko et al. | |
| 2016/0381591 A1 | 12/2016 | Lysejko et al. | |

FOREIGN PATENT DOCUMENTS

| | | |
|---|---|---|
| EP | 0654915 A2 | 5/1995 |
| EP | 1903348 A1 | 3/2008 |
| EP | 2113145 A1 | 11/2009 |
| EP | 2207267 A2 | 7/2010 |
| EP | 2391157 A2 | 11/2011 |
| EP | 2448144 A1 | 5/2012 |
| EP | 2506625 A1 | 10/2012 |
| EP | 2538712 A1 | 12/2012 |
| GB | 2318914 A | 5/1998 |
| GB | 2484377 A | 4/2012 |
| JP | H05188128 A | 7/1993 |
| JP | H06188802 A | 7/1994 |
| KR | 101346062 B1 | 12/2013 |
| WO | 9426001 A1 | 11/1994 |
| WO | 199965105 A1 | 12/1999 |
| WO | 0152447 A2 | 7/2001 |
| WO | 0231908 A2 | 4/2002 |
| WO | 03096560 A1 | 11/2003 |
| WO | 2004095764 A2 | 11/2004 |
| WO | 2004114546 A1 | 12/2004 |
| WO | 2005064967 A1 | 7/2005 |
| WO | 2007010274 A1 | 1/2007 |
| WO | 2007069809 A1 | 6/2007 |
| WO | 2008/064696 A1 | 6/2008 |
| WO | 2008111882 A1 | 9/2008 |
| WO | 2008151057 A2 | 12/2008 |
| WO | 2010077790 A1 | 7/2010 |
| WO | 2011044947 A1 | 4/2011 |
| WO | 2011060058 A1 | 5/2011 |
| WO | 2014106539 A1 | 7/2014 |

OTHER PUBLICATIONS

PCT Search Report from PCT/GB2016/051205, dated Jul. 25, 2016, 13 pgs.
Office Action in related Case U.S. Appl. No. 15/186,134 dated Nov. 22, 2016, 18 pages.
U.S. Notice of Allowance from U.S. Appl. No. 15/186,134 dated Mar. 14, 2017, 8 pages.
U.S. Office Action in U.S. Appl. No. 15/182,209 dated Apr. 13, 2017, 17 pages.
PCT Written Opinion from PCT/GB2016/051195, dated May 17, 2017, 5 pgs.
PCT Written Opinion from PCT/GB2016/051205, dated May 16, 2017, 5 pgs.
PCT Written Opinion from PCT/GB2016/051234, dated May 17, 2017, 10 pgs.
PCT Written Opinion from PCT/GB2016/051285, dated May 10, 2017, 5 pgs.
PCT Written Opinion from PCT/GB2016/051360, dated Jun. 1, 2017, 6 pgs.
PCT Written Opinion from PCT/GB2016/051428, dated Jun. 2, 2017, 12 pgs.
PCT Written Opinion from PCT/GB2016/051615, dated May 17, 2017, 5 pgs.
PCT Written Opinion from PCT/GB2016/051759, dated May 18, 2017, 6 pgs.
UK Search Report from GB 1514938.8, dated Apr. 18, 2016, 4 pgs.
UK Search Report from GB 1516901.4, dated Mar. 18, 2016, 5 pgs.
UK Search Report from GB 1518654.7, dated Mar. 24, 2016, 3 pgs.
UK Search Report from GB 1519216.4, dated Apr. 15, 2016, 5 pgs.
UK Search Report from GB 1519220.6, dated Apr. 4, 2016, 4 pgs.
UK Search Report from GB 1519228.9, dated Apr. 29, 2016, 4 pgs.
UK Search Report from GB 1519270.1, dated Apr. 25, 2016, 5 pgs.
UK Search Report from GB 1519272.7, dated Jun. 10, 2016, 3 pgs.
UK Search Report from GB 1519273.5, dated Apr. 27, 2016, 3 pgs.
Doi et al., "Low-Cost Antenna Array Via Antenna Switching for High Resolution 2-D DOA Estimation," SIPS 2013 Proc. IEEE, Oct. 16, 2013, pp. 83-88.
Jung et al., "Attitude Sensing Using a GPS Antenna on a Turntable: Experimental Tests," Navigation, J. of the Institute of Navigation, Fairfax, VA, US, vol. 51, No. 3, Dec. 1, 2004, pp. 221-230.
PCT Search Report from PCT/GB2016/051234 (corresponding to U.S. Appl. No. 15/187,570), dated Aug. 5, 2016, 13 pgs.
PCT Search Report from PCT/GB2016/051360 (corresponding to U.S. Appl. No. 15/187,900), dated Aug. 19, 2016, 12 pgs.
PCT Search Report from PCT/GB2016/051615 (corresponding to U.S. Appl. No. 15/187,515), dated Aug. 12, 2016, 13 pgs.
PCT Search Report from PCT/GB2016/051617 (corresponding to U.S. Appl. No. 15/187,616), dated Aug. 23, 2016, 11 pgs.
PCT Search Report from PCT/GB2016/051618 (corresponding to U.S. Appl. No. 15/187,602), dated Aug. 12, 2016, 12 pgs.
PCT Search Report from PCT/GB2016/051759 (corresponding to U.S. Appl. No. 15/187,680), dated Sep. 14, 2016, 15 pgs.
Office Action in related Case U.S. Appl. No. 15/187,515 dated Dec. 7, 2017, 9 pages.
U.S. Notice of Allowance from U.S. Appl. No. 15/182,209 dated Nov. 22, 2017, 13 pages.
U.S. Notice of Allowance from U.S. Appl. No. 15/187,574 dated Dec. 15, 2017, 14 pages.
U.S. Notice of Allowance from U.S. Appl. No. 15/187,616 dated Jan. 9, 2018, 12 pages.
U.S. Office Action in U.S. Appl. No. 15/187,574 dated Dec. 15, 2017, 14 pages.
PCT Search Report from PCT/GB2016/051285, dated Jul. 13, 2016, 12 pgs.
UK Search Report from GB 1519237.0, dated Jun. Apr. 10, 2016, 3 pgs.
PCT Search Report from PCT/GB2016/051428 (corresponding to U.S. Appl. No. 15/187,188), dated Dec. 13, 2016, 19 pgs.

* cited by examiner

CONFIGURABLE ANTENNA AND METHOD OF OPERATING SUCH A CONFIGURABLE ANTENNA

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. UK 1519220.6, filed 30 Oct. 2015 and entitled "A CONFIGURABLE ANTENNA AND METHOD OF OPERATING SUCH A CONFIGURABLE ANTENNA". Both applications are incorporated by reference herein.

TECHNICAL FIELD

The present disclosure relates to a wireless network. More particularly it relates to an antenna apparatus used as a node in the wireless network.

BACKGROUND

A wireless network may be provided to serve a range of different functions, but one use of a wireless network is to perform backhaul in a communications network where user equipment devices (e.g. mobile telephones) communicate with nodes of the wireless network and the wireless network then enables these nodes to communicate with other nodes of the wireless network, which then connect (typically in a wired manner) to a physical communications infrastructure and then on to a wired communications network such as the interne. There are a number of different use cases and different types of backhaul technologies available to mobile network operators, but in this context there are a number of reasons why it would be desirable to provide terminal nodes of a wireless backhaul network (also referred to herein as feeder terminals) which only communicate with user equipment within a relatively small cell. Small cell deployment can be useful to provide the enhanced quality of service demanded by the ever increasing number of mobile data consumers. Small cells have a number of advantages such as: they allow capacity hot-spots to be targeted to ease congestion, they are appropriate for deploying in a dense outdoor urban environment, for example on street furniture, they can be deployed in specific known "not-spots" where macrocell coverage is poor or within indoor not-spots which experience steady daily traffic with occasional significant peaks, such as dense urban indoor environments like stadiums, shopping malls, and so on. Further, small cells may also be appropriate for mobile deployment, such as in trains, or other moving transport.

In the wireless backhaul use case discussed above, a feeder terminal (FT), i.e. the backhaul node nearest to an access point (AP), which may for example be an eNodeB (eNB) in the context of LTE, may typically be mounted on street furniture or a building façade perhaps 3-6 meters above street level. Conversely, a feeder base (FB), i.e. the backhaul node nearest to the core network, utilises the same infrastructure as the access macro network.

In view of the above usage context, it is inevitable that some degree of outage will occur when the backhaul connectivity is unavailable. Outage may for example occur when there is equipment failure, or a persistent or temporary physical obstruction such as heavy rain or vehicles in the line of sight of the backhaul link. Although the use of small cells may enable the target availability of the connectivity to be relaxed, it would advantageous if the nodes of the wireless network were able to reconfigure themselves to provide different communications paths when such outage does occur. Moreover, given the greater number of FTs which need to be deployed when smaller cells are used, in order to facilitate fast, large scale deployment with little engineering required at a new installation site, the ability for the nodes (both FTs and FBs) to self-organise and self-configure is very desirable.

In the context of wireless networks, a further consideration which may need to be allowed for is the carrier frequency in which the wireless network operates, both in terms of the corresponding propagation which the carrier frequency allows, but also in terms of the regulatory licencing regimes which apply to a given carrier frequency. Whilst it would be advantageous to provide a wireless network which operates in a licence-exempt frequency band, due to its free availability, the lack of official regulation in such an unlicensed band means that the wireless network must be able to cope with co-channel and adjacent channel interference from unsolicited and uncoordinated wireless sources and furthermore despite any initial well planned deployment, if the wireless network is to be durable (in time) it must be able to adapt rapidly to static or dynamic, fixed or mobile radio traffic from other sources. One possible approach to the provision of a wireless backhaul network in such an environment would be the use of a contention-based protocol such as IEEE802.11 (WiFi), but then care must be exercised to ensure that the access does not interfere with the backhaul by separating the two air interfaces into separate bands, yet nonetheless other mobile devices or operators may still use the same spectrum causing significant interference. Although the widespread availability of WiFi may represent a cheaper approach, WiFi cannot quickly address rapid spatial and temporal interference pattern variations, making it in practice less suitable for the stringent requirements of real time backhaul services. Moreover the use of WiFi can be expected to require careful engineering and to be used in narrow point-to-point modes, which limits its deployment possibilities.

SUMMARY

In one example embodiment there is an antenna apparatus comprising: a directional antenna comprising a plurality of antenna array components; a plurality of RF chains connected to the plurality of antenna array components; a transceiver connected to the plurality of RF chains, wherein each RF chain comprises in sequence: a switching stage having switching circuitry selectively to connect an antenna array component; a phase shifting stage having phase shifting circuitry; and a summation stage having summation circuitry, wherein at least two of the RF chains share phase shifting circuitry and at least two of the RF chains share summation circuitry.

The antenna apparatus has a directional antenna, which is made up of a plurality of antenna array components. This antenna is "directional" in the sense that the configuration of the antenna array components enables the antenna to utilise a beam pattern which has a notable degree of directionality for at least some configurations of the antenna array components. Each of the antenna array components is connected via a RF chain to a transceiver such that the antenna can be used both in reception and transmission to wirelessly transmit digital signals received by the transceiver and to convert wireless signals received by the transceiver into digital signals. As such it should be appreciated that the term "RF chain" here can refer to a sequence of components that supports signal propagation in the transmission direction or one that supports signal propagation in the reception direction, and indeed some embodiments provide shared RF chains of which some components can be used in either direction.

In order to provide the selective configuration of the plurality of antenna array components, the RF chain comprises a switching stage which can selectively connect each antenna array component (i.e. such that it will (not) be connected to the transceiver and will (not) participate in the transmission/reception), a phase shifting stage to apply a phase shift to the signals passing through the RF chain (in reception mode) and may have further components such as a gain (also referred to as attenuation for gain <1) stage. Providing such a complete RF chain for each antenna array component would give the directional antenna a great deal of configurability, but the present techniques recognise that there are contexts in which advantage of such full configurability may not outweigh the disadvantage of the size and expense of a full RF chain provided for each antenna array component. For example, phase shifters in particular are expensive in cost and physically large. One context in which the above mentioned trade off between full configurability and cost/size is acute is in the context of an antenna apparatus used for a node of a wireless backhaul network which provides a large number of relatively small cells, and hence terminal nodes to service those small cells, which each will have an antenna apparatus.

The present techniques recognise that an advantageous balance between these competing requirements may be achieved by providing the RF chains which connect the plurality of antenna array components to the transceiver in a manner which phase shifting circuitry in the RF chains is shared between at least two of the RF chains. Moreover, summation circuitry of the RF chains is shared between at least two of the RF chains. In combination with a switching stage provided in each RF chain which enables the above mentioned selective connection of that antenna array component to the transceiver, whilst on the one hand this means that at least two antenna array components cannot be used entirely independently (due to the fact that there are components of their respective RF chains which are shared), nevertheless a wide and useful range of configurations of the beam patterns which can be generated for the directional antenna is nonetheless achievable. Moreover, a physically smaller and cheaper antenna apparatus is thus provided.

In some embodiments the plurality of RF chains comprises a further summation stage having further summation circuitry, wherein the further summation stage is between the switching stage and the phase shifting stage, and the summation stage is configured to combine output from two RF chains to forward to the shared phase shifting circuitry. Accordingly, two different levels of summation are usefully provided between the direct output of the plurality of antenna array components and the transceiver, since on the one hand this allows a further reduction in the size and cost of the RF chain electronics and by combining outputs from two of the plurality of the antenna array components to forward to the shared phase shifting circuitry, both antenna components can continue to be used, but still with the above-mentioned advantage of the shared phase shifting circuitry.

In some embodiments the plurality of RF chains comprises a gain stage having gain circuitry, wherein at least two of the RF chains share gain circuitry. Further compactification of the RF chains can therefore be achieved, where the present techniques recognise that a useful number of beam patterns may nevertheless be generated, even where the gain of these at least two RF chains that share the gain circuitry must necessarily be the same.

The gain circuitry may be provided in a variety of ways but in some embodiments the gain circuitry of the gain stages is responsive to a gain control signal to select a fixed gain. In other embodiments the gain circuitry of the gain stages is responsive to a gain control signal to select a variable gain.

The phase shifting circuitry may be provided in a variety of ways, but in some embodiments the phase shifting circuitry of the phase shifting stages comprises a plurality of fixed length phase paths, and the phase circuitry comprises phase selection circuitry responsive to a phase selection signal to route the RF chain via one of the plurality of fixed length phase paths. Providing the selective phase shifting that is applied by the phase shifting circuitry using fixed length phase paths provides a simple, and therefore physically smaller and cheaper, manner of supporting phase shifting for the antenna array components concerned. Although full variability of the phase which may be applied is therefore not supported, once more the present techniques have found that by providing a selected number of fixed length phase paths the size and cost of the device may be kept down while still allowing a good degree of configurability of beam patterns. The number and length of the fixed length phase paths available may therefore vary, but in one example there are three fixed length phase paths, having phase lengths of 0°, 60° and 120° which are applied to outer antenna array components, whilst a set of three fixed length phase paths having respective lengths of 0°, 30°, and 60° is used for a central antenna array component, and thus providing the ability, by selection and combination, to apply phase ramps of +/−60°, +/−30° and 0° across the array.

The directional antenna may be variously provided, but in some embodiments the directional antenna is a uniform linear antenna array. This configuration of the directional antenna, in particular the regular and repeating pattern of the antenna array components, provides a configuration that is both lower cost (due to the repeated nature of the physical components) and one that is readily configurable.

The antenna array components may take a variety of forms, but in some embodiments the plurality of antenna array components comprises a plurality of antenna array elements arranged in columns to form the antenna array components. It should be understood that these columns are then typically arranged vertically, such that the beam patterns which may then be generated from a set of such columns then has the configurability of the beam shape in a horizontal plane, appropriate for the context of nodes of a close-to-ground wireless network.

In some embodiments the antenna array elements at one end of the columns of antenna array elements are connected to a first RF chain which is independent of a second RF chain connected to the antenna array elements at an opposite end of the columns of antenna array elements. These opposite ends could be the top and bottom sides of the array, but could also be the left and right sides. These independent first and second RF chains enable polarizations of ±45° to be applied in order to support transmission and reception of orthogonal signal components. It may be advantageous to utilise orthogonal polarizations, just three examples of these being: +/−45°, vertical/horizontal, and right-hand and left-hand circular polarization.

In some embodiments the antenna apparatus further comprises a mounting portion configured to be fixed relative to a physical location of the antenna apparatus, wherein the directional antenna is configured to be rotatably positioned about an axis with respect to the mounting portion, and the plurality of RF chains are fixedly located with respect to the directional antenna. As discussed above, the directional antenna of the present techniques is provided with an advantageous degree of electronic configurability, but its configurability is even greater if the directional antenna itself can be rotated around a fixed axis (fixed relative to the physical location of the antenna apparatus, e.g. on an immovable object such as street furniture or a building), and whilst this rotational positioning in azimuth about this axis could be provided by selecting this azimuthal position when installing the antenna apparatus, the present techniques recognise that a yet greater degree of configurability of the antenna apparatus and hence of the wireless network in which is participates as a whole, is provided if the directional antenna can be rotatably positioned in operation about this axis. For example, this can be provided by means of a vertically mounted motor and associated control circuitry which can then select and implement a given antenna azimuthal direction.

Further, the present techniques recognise that whilst the plurality of RF chains could in principle be provided at a number of locations with respect to the directional antenna, it is beneficial if they are fixedly located with respect thereto. This is because when the directional antenna can be rotatably positioned, a connection between the antenna array components and the plurality of RF chains, or a middle connection within the plurality of RF chains, would then have to bridge the rotating interface between the directional antenna and the mounting portion, and this would likely result in a degradation of the signal quality transferred along the RF chain. It is therefore beneficial to fix the RF chains with respect to the directional antenna such that when it rotates, they rotate.

This configuration may be provided in a variety of ways, but in some embodiments the plurality of RF chains are located behind the plurality of antenna array components. In other words, where it is recognised that the antenna array components will have a given direction with respect to which they transmit/receive the RF chains can then be located on an opposite side of the plurality of antenna array components, which ensures a short connection between the antenna array components and the RF chains and thus a greater signal fidelity. A generally more compact antenna is also provided.

In some embodiments the antenna apparatus further comprises a rear directional antenna, where a rear RF chain of the plurality of RF chains is connected to the rear directional antenna and the rear RF chain is at least partially shared with a RF chain connected to an antenna array component of the plurality of antenna array components; and at least one RF chain comprises a further switching stage, wherein the further switching stage is configured to selectively connect only one of: the antenna array component and the rear directional antenna to the at least partially shared RF chain. The additional provision of a rear directional antenna gives the opportunity for the range of shapes of beam pattern generated by the antenna apparatus to be commensurately larger. Nevertheless, in itself the provision of a rear directional antenna with its own rear RF chain could increase the size of the set of RF chains in an undesirable manner, but the present techniques mitigate against this by ensuring that the rear RF chain is at least partially shared with a RF connected to an antenna array component (i.e. of the front facing directional antenna). Moreover the degree of sharing between the rear RF chain and the "front" RF chain is still further enhanced by the present techniques, which provide a further switching stage which will only allow one of the (front) antenna component and the rear directional antenna to be connected to the at least partially shared RF chain. This further switching stage is therefore most usefully provided close to the antenna array components and the rear directional antenna, since then essentially the entirety of the RF chain can be shared and a particularly compact set of RF chains are provided. The present techniques have nevertheless found that a useful range of beam patterns which include the use of either the rear directional antenna or the (front) antenna array component with which it shares the RF chain can nevertheless be provided.

In some embodiments the rear directional antenna is fixedly mounted with respect to the directional antenna, wherein the rear directional antenna is oriented in a substantially opposite direction to the directional antenna, and wherein the plurality of RF chains are located between the directional antenna and the rear directional antenna. In other words, the rear directional antenna and the directional antenna are mounted essentially back-to-back and the plurality of RF chains is to be found sandwiched between them. This enables a particularly compact arrangement of the directional antenna, the rear directional antenna and the plurality of RF chains, such that overall an advantageously small and compact antenna apparatus is provided.

The rear directional antenna may be provided in a variety of ways but in some embodiments is a rear uniform linear antenna array. As mentioned above, the regularity and repeating individual physical units of a uniform linear antenna array are advantageous in that a good degree of configurability and yet a lower cost of manufacture are supported.

In some embodiments the antenna apparatus further comprises a uniform circular antenna array comprising a plurality of circular antenna array components, wherein a uniform circular antenna RF chain of the plurality of RF chains is connected to a uniform circular antenna array component and the uniform circular antenna RF chain is at least partially shared with a RF chain connected to an antenna array component of the plurality of antenna array components; and at least one RF chain comprises a further switching stage, wherein the further switching stage is configured to selectively connect only one of: the antenna array component and the uniform circular antenna array component to the at least partially shared RF chain. Thus, the antenna apparatus may additionally have a uniform circular antenna array which will then be able to receive and transmit in a isotropic manner (as opposed to the directional manner of the directional antenna and the rear directional antenna) and whilst this uniform circular array could be used in a variety of ways for the transmission and reception capabilities of the antenna apparatus, one useful manner of using such a uniform circular antenna array is to allow the antenna apparatus to listen passively to its environment to determine and characterise external sources of interference, and also to participate in a sounding procedure in which the operation of the antenna apparatus is coordinated with that of at least one other antenna apparatus, where only one antenna apparatus transmits at a time whilst the others listen. The results of such external interference source characterisation and network sounding can then be used to guide the configuration of the antenna apparatus in order to minimize the effect of such external inference and to select transmission paths in a network of antenna apparatuses which maximize (or at least improve) the overall throughput. Moreover, since the uniform circular antenna RF chain is at least partially shared with a RF chain of the plurality of antenna array components, this capability can be provided without increasing the size of the full set of RF chains, because, as in the case above of the rear directional antenna, the provided further switching stage can be positioned to ensure that essentially all of the at least partially shared RF chain is shared.

In order to only use the directional antenna for data transmission/reception and to use the uniform circular antenna array for the above mentioned configurational set up procedures of characterising external interference forces and sounding, control circuitry can be provided ensure that these are only performed at mutually exclusive times. In other words, in some embodiments the antenna apparatus comprises control circuitry to time-multiplex operation of the uniform circular antenna array and the directional antenna.

In some embodiments the antenna apparatus comprises beam pattern control circuitry to control activation, gain and phase of the antenna or antennas of the antenna apparatus such that the antenna apparatus is operated in a selected mode with a selected beam pattern of a set of beam patterns, wherein the set of beam patterns provides a range of directionality and interference nulling. Hence, the beam pattern control circuitry can not only cause the components of the antenna(s) (i.e. front, rear and/or circular as appropriate) to be selectively activated but also the shape of the beam pattern selected to be varied to give an advantageous range of directionality and interference nulling in the beam pattern ultimately generated. The modes may be variously defined, but in one embodiment nine modes of operation are defined for the antenna apparatus, five relating to the front directional antenna, one relating to the rear directional antenna and three relating to the circular antenna. The number of beam patterns available in the set of beam patterns can vary, because as described above this essentially relates to a trade-off between the more complex RF chains which must be provided to support a larger number of possible beam patterns and a sufficient number of different beam patterns being supported to enable a sufficiently good degree of configurability of the beam patterns of antenna apparatus to cope with the demanding environment in which it may have to operate. For example, in some embodiments there are nine modes of operation and 130 beam patterns available.

The selection of the mode and beam pattern may be made in a variety of ways, but in some embodiments the beam pattern control circuitry is responsive to an instruction received from a wireless network controller for a wireless network comprising more than one antenna apparatus to cause the antenna apparatus to be operated in the selected mode with the selected beam pattern. The involvement of a wireless network controller for the wireless network to select the mode and beam pattern for a given antenna apparatus is advantageous because of the coordination between the configurations of the antenna apparatuses which can then be supported. However, in some embodiments the beam pattern control circuitry is responsive to a configuration determined in the antenna apparatus to cause the antenna apparatus to be operated in the selected mode with the selected beam pattern. In other words, the antenna apparatus may thus be able, alternatively or in addition, to determine its own configuration. This may be useful where for example the antenna apparatus has been initially deployed and the antenna apparatus can independently configure itself to what is expected to be a generally reasonable configuration based on other constraints such as physical location and approximate distance/direction to other known antenna apparatuses, or may comprise a more computationally capable component of the antenna apparatus being able to perform an analysis of signals received when characterising external interference or during an organised sounding process in order to determine its own configuration.

The antenna apparatus may play different roles in a wireless network, and in some embodiments the selected mode and beam pattern are used to operate the antenna apparatus in a point-to-point mode in a wireless network. In other situations the selected mode and beam pattern are used to operate the antenna apparatus in a point to multi-point mode in a wireless network. In other words, the antenna apparatus may operate as a hub or may only communicate with one other antenna apparatus, and further may indeed operate as a middle of a chain component or may operate as a terminal component.

In another example embodiment there is a method of operating an antenna apparatus comprising the steps of: connecting a plurality of antenna array components via a plurality of RF chains to a transceiver, wherein at least two of the RF chains share phase shifting circuitry and at least two of the RF chains share summation circuitry; and in forward or reverse sequence in at least one RF chain: selectively connecting an antenna array component to a shared RF chain; phase shifting using a shared phase shifting stage of the shared RF chain; and summing using a shared summation stage of the shared RF chain.

In another example embodiment there is an antenna apparatus comprising: means for directionally transmitting and receiving wireless signals comprising a plurality of antenna array components; means for providing a plurality of RF chains to connected the plurality of antenna array components to a transceiver; means for transceiving signals carried by the plurality of RF chains, wherein each RF chain comprises in sequence: means for selectively disconnecting an antenna array component; means for phase shifting; and means for summing, wherein at least two of the RF chains share the means for phase shifting and at least two of the RF chains share the means for summing.

BRIEF DESCRIPTION OF THE DRAWINGS

The present techniques will be described further, by way of example only, with reference to embodiments thereof as illustrated in the accompanying drawings, in which.

DESCRIPTION OF EMBODIMENTS

Figure 1:
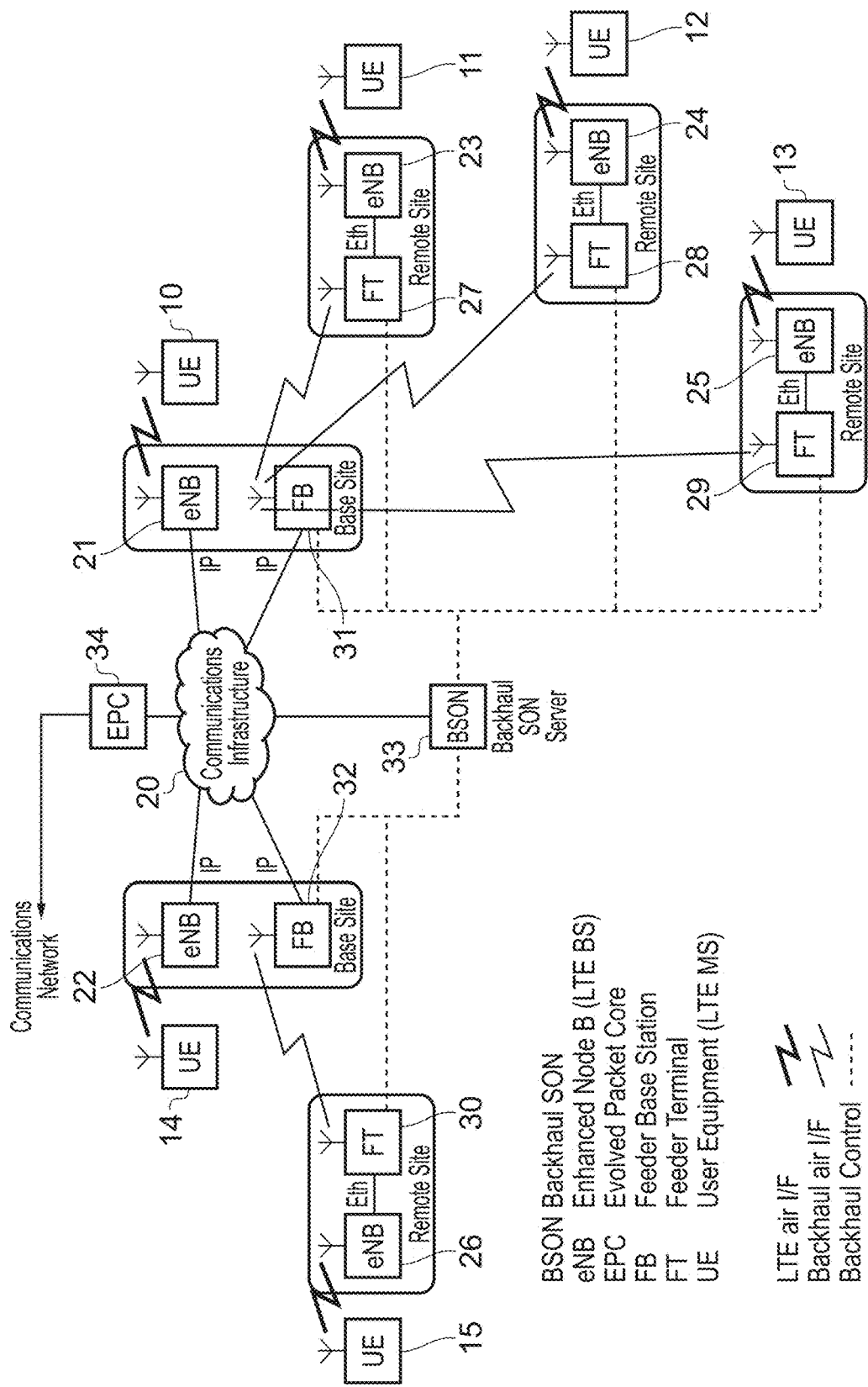
FIG. 1 schematically illustrates a communications network providing connectivity for end user equipment which employs a wireless backhaul network in which antenna apparatuses of some embodiments may be deployed to provide backhaul nodes.

Some particular embodiments are now described with reference to the figures. FIG. 1 schematically illustrates a multi-component network which provides connectivity for user equipment (UE) to a communications network such as the internet. The items of user equipment 10-15 of this example communicate wirelessly with LTE base stations—enhanced node Bs (eNBs). These eNBs then either have a direct wired connection (via IP protocol) with the communications infrastructure 20 in the case of 21 and 22, or are connected to an associated feeder terminal (FT) in the case of eNBs 23-26. Each FT is in wireless communication with a feeder base (FB), shown as 31 and 32 in the figure. These FBs are then provided with a wired connection (via IP protocol) to the communications infrastructure 20. Also shown is a backhaul self-organising network (SON) server (controller) 33 which is also shown to be in communication via the dashed line labelled "backhaul control" with the FTs and FBs of the wireless backhaul network, but it should be appreciated that this connection shown is logical and in fact will typically be provided via the wired connection to the communications infrastructure and the wired and/or wireless connection discussed above leading to these FBs and FTs. The communications infrastructure 20 is connected to a communications network (e.g. the internet) via the evolved packet core (EPC) 34. In the particular example of the wireless backhaul network shown in FIG. 1, the nodes (FBs and FTs) are intended to support the provision of relatively small cells, to the easily and rapidly deployable, and to operate well in an unlicensed region frequency band, such that they must be able to cope with co-channel and adjacent channel interference from unsolicited and uncoordinated wireless sources and furthermore be adaptable when the conditions in which they are operating change.

Figure 2:
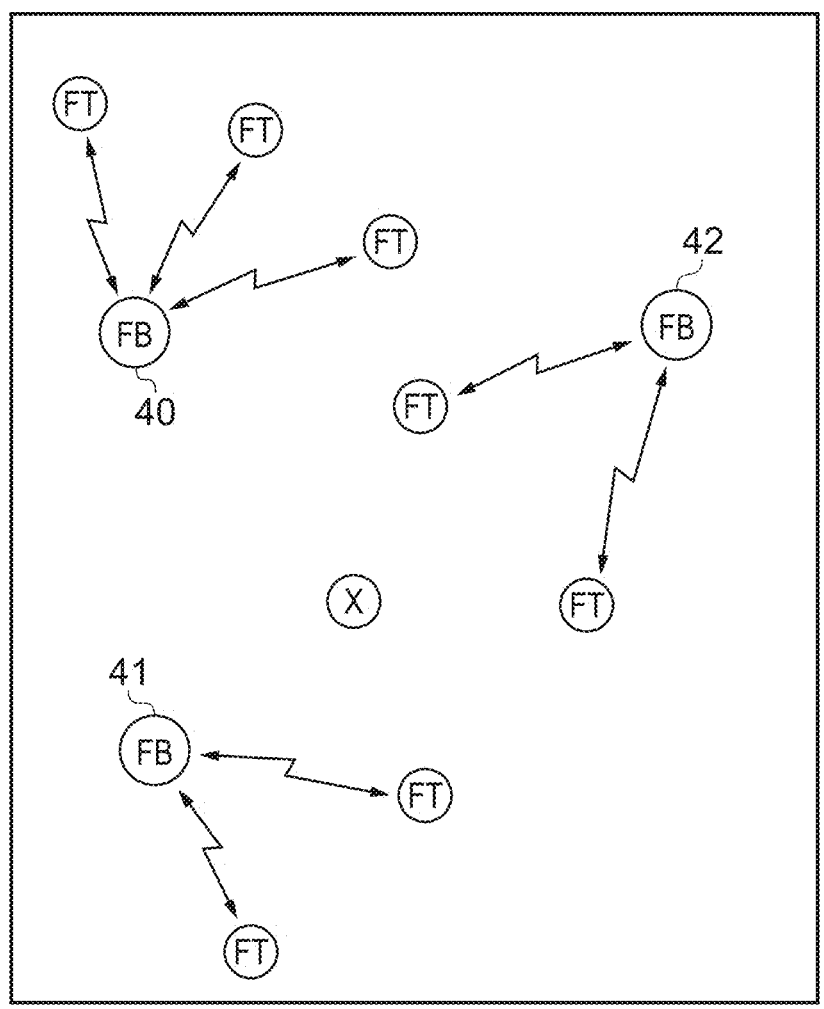
FIG. 2 schematically illustrates a number of feeder bases and feeder terminals in a wireless backhaul network and a source of external interference.

In FIG. 2, seven FTs are shown and three FBs as well as a source of external interference "X". Accordingly, in order to provide good throughput in this wireless backhaul network, this is improved if each node (FT and FB) of the wireless backhaul network are configurable in order to provide a high spectral efficiency. The wireless communication paths shown in FIG. 2 correspond generally to the line of sight (LOS) path between a FB and a FT, and therefore it is advantageous if the antenna provided in association with each FT and FB can be orientated to provide a strong beam in the direction of its communication partner and to suppress interference from other sources. For example, taking FB 40 as an example, it can be seen that if the directionality of its antenna is approximately aligned with the middle FT with which it communicates, but has a sufficiently broad beam width, then good communication throughput with its associated FTs can be achieved without significant interference from the other items in the figure arising. Similarly, the FB 41 can achieve the same by being orientated in a direction lying approximately between the two FTS with which it communicates, and having a beam width with sufficient width to accommodate both the line of sight directions to each of its communication partners. However, in both examples (FB 40 and FB 41), this may further depend of the strength of the external source "X", and if this is sufficiently strong in their direction, the directional orientation of FB 40 and the FB 41 may be better turned slightly away from the source "X", to reduce the interference which it generates. This is potentially a more significant problem for the FB 42, since the external interference source lies between the line of sight directions to its two communications partners. Accordingly, FB 42 may need to be generally orientated in the direction of the external interference source "X" but a beam pattern may be best selected which has a strong null in its central direction, but with reasonably strong lobes in the direction of its communication partner FTs in order to maximise the signal to noise ratio which it can achieve.

Figure 3:
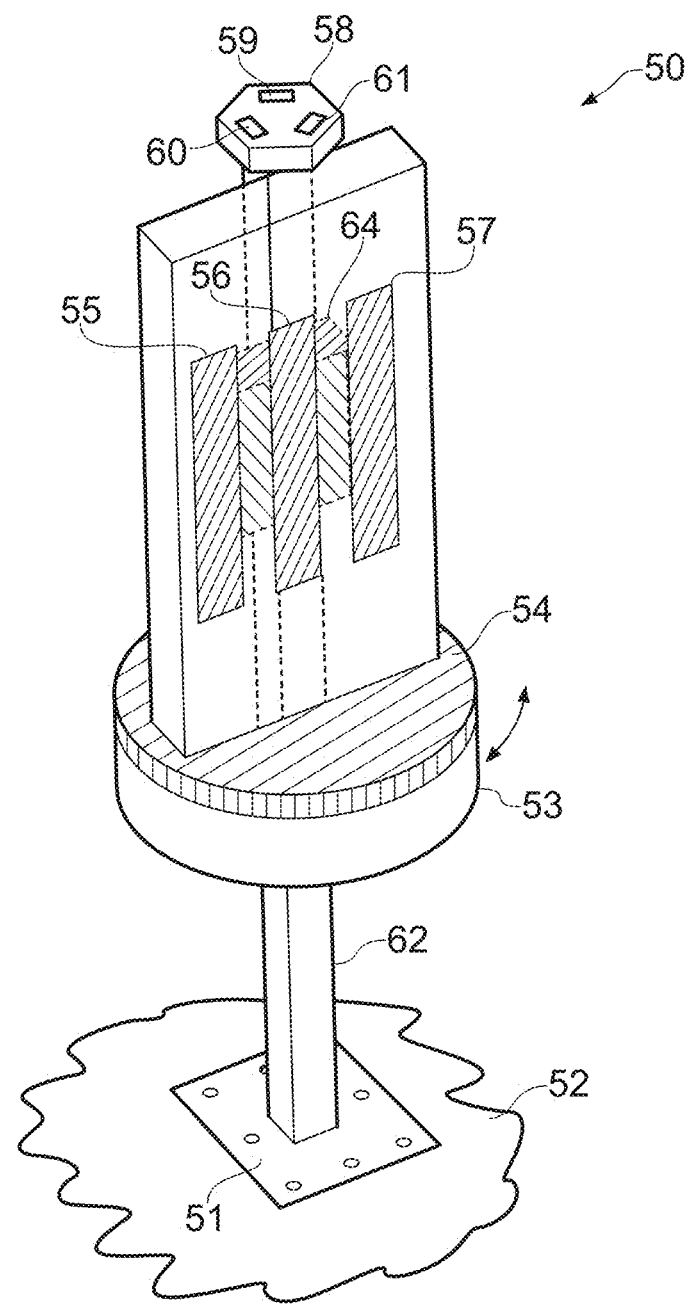
FIG. 3 schematically illustrates an antenna apparatus in one embodiment.

FIG. 3 schematically illustrates the general configuration of an antenna apparatus according to the present techniques, in one embodiment. The antenna 50 has a base plate 51 which enables the antenna to be fixedly mounted to its physical location 52. The base plate 51 and the physical location 52 shown is just one example, where in FIG. 3 the physical location 52 is essentially a flat surface, but it should be appreciated that the fixing of the antenna can be provided in a variety of ways, in dependence of the style of configuration which is desired and the type of physical location to which the antenna should be attached. For example, where the antenna should typically be connected to a vertical component such as to the side of a building, street furniture, and so on, a simple mounting bracket directly provided on the side of the base portion 53 may be more appropriate. The base portion 53 remains fixed whilst the rotating portion 54 is able to rotate through at least 360°, by means of a motor within the base portion 53 (not visible in this figure) which causes the rotating portion 54 to be rotated and held at a particular position with respect to the base portion 53. The example antenna 50 has a directional antenna formed of 3 antenna array components 55, 56 and 57, which can be seen in FIG. 3 to be elongate columns. Also visible in FIG. 3 is a circular antenna array 58 formed of 3 antenna components 59, 60 and 61. This is mounted atop the vertical column 62 which runs from the base plate 51 through the antenna apparatus 50, such that the circular antenna is fixed with respect to the physical location 52 of the antenna apparatus, but this need not be the case and other embodiments are conceivable in which the circular antenna is mounted on top of the directional array, so that it rotates therewith. Partially shown in FIG. 3 are the RF electronics 64 which are situated behind the directional array, and couple the antenna array components 55-57 to a transceiver (also not shown). This arrangement wherein the RF chains are physically closely located to the antenna array components means that, despite the rotational capability of the antenna apparatus, good signal fidelity is nevertheless maintained. Only a limited number of signals need be transferred from the rotating RF chain electronics 64 across the rotating interface to the fixed portion 53. It should be appreciated that the antenna apparatus 50 will typically also be provided with a radome cover to protect its components, but this has been removed in the illustration of FIG. 3 for clarity of illustration purposes only.

Figure 4:
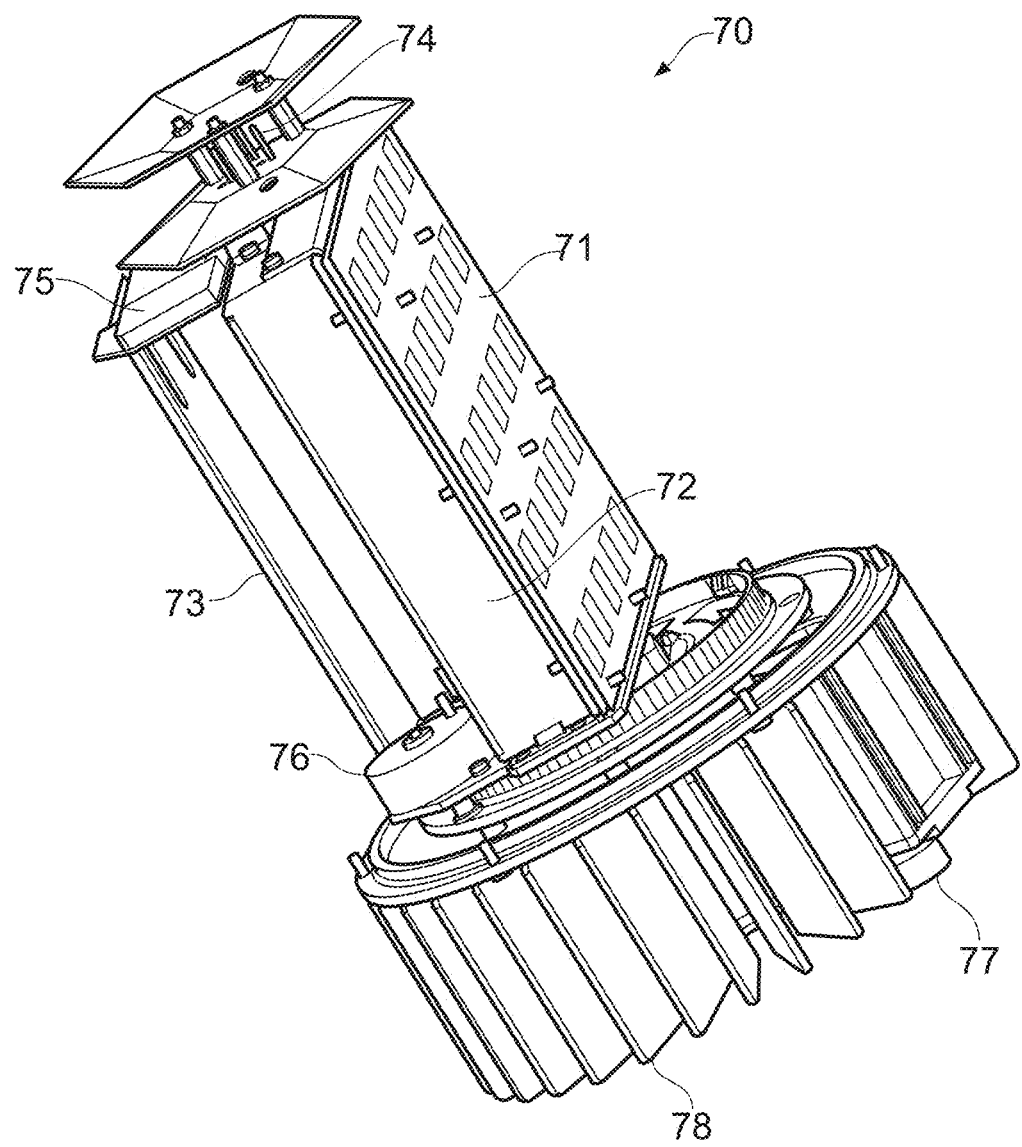
FIG. 4 schematically illustrates an antenna apparatus in one embodiment.

FIG. 4 schematically illustrates in more detail the components of an antenna apparatus 70 in one embodiment. In this embodiment, the directional antenna 71 can be seen to comprise 25 antenna array components arranged in a 5×5 grid. RF and base band electronics (i.e. essentially the RF chains) 72 are provided behind the main directional antenna assembly. These are not directly visible in the illustration of FIG. 4 due to the casing. The antenna 70 further comprises a rear-firing antenna 73 which is orientated in the opposite direction to the front firing main antenna 71. Although not visible in FIG. 4, the rear firing antenna 73 comprises a single column of antenna array elements forming a single antenna array component, which is physically very similar to a single column within the 5×5 array of antenna array elements of the front antenna 71. A circular antenna 74 is mounted on top of the front-firing main antenna 71 and is configured as a triple-monopole antenna which is used, as described above, for assessing the environment in which the antenna 70 finds itself. A further GPS antenna 75 is also provided in the antenna apparatus 70, which is used for node location, orientation and precise time synchronisation. A motorised steering mechanism 76 enables the antenna apparatus to be orientated in any direction in azimuth, and a gigabit Ethernet network interface 77 is provided to connect the antenna further. The fins 78 are for heat dissipation. Note also that the RF and base band electronics 72 mounted behind the front firing main antenna 71 are also connected to the circular antenna 74 and the rear firing antenna 73 as will be discussed in more detail below.

Figure 5A:
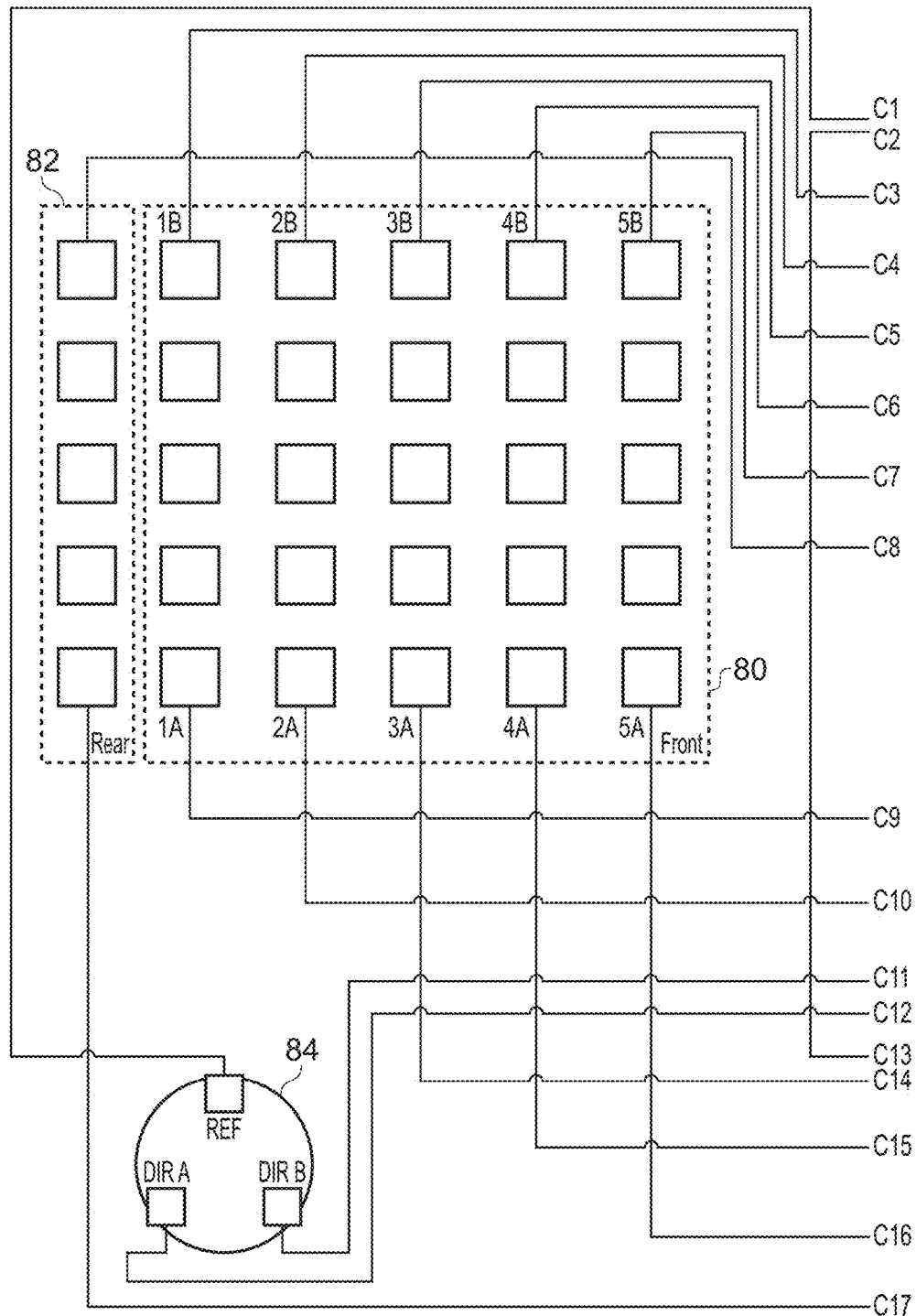
FIGS. 5A, 5B and 5C schematically illustrate RF chains which are at least partially shared between front, back and circular antenna array components in one embodiment.
Figure 5B:
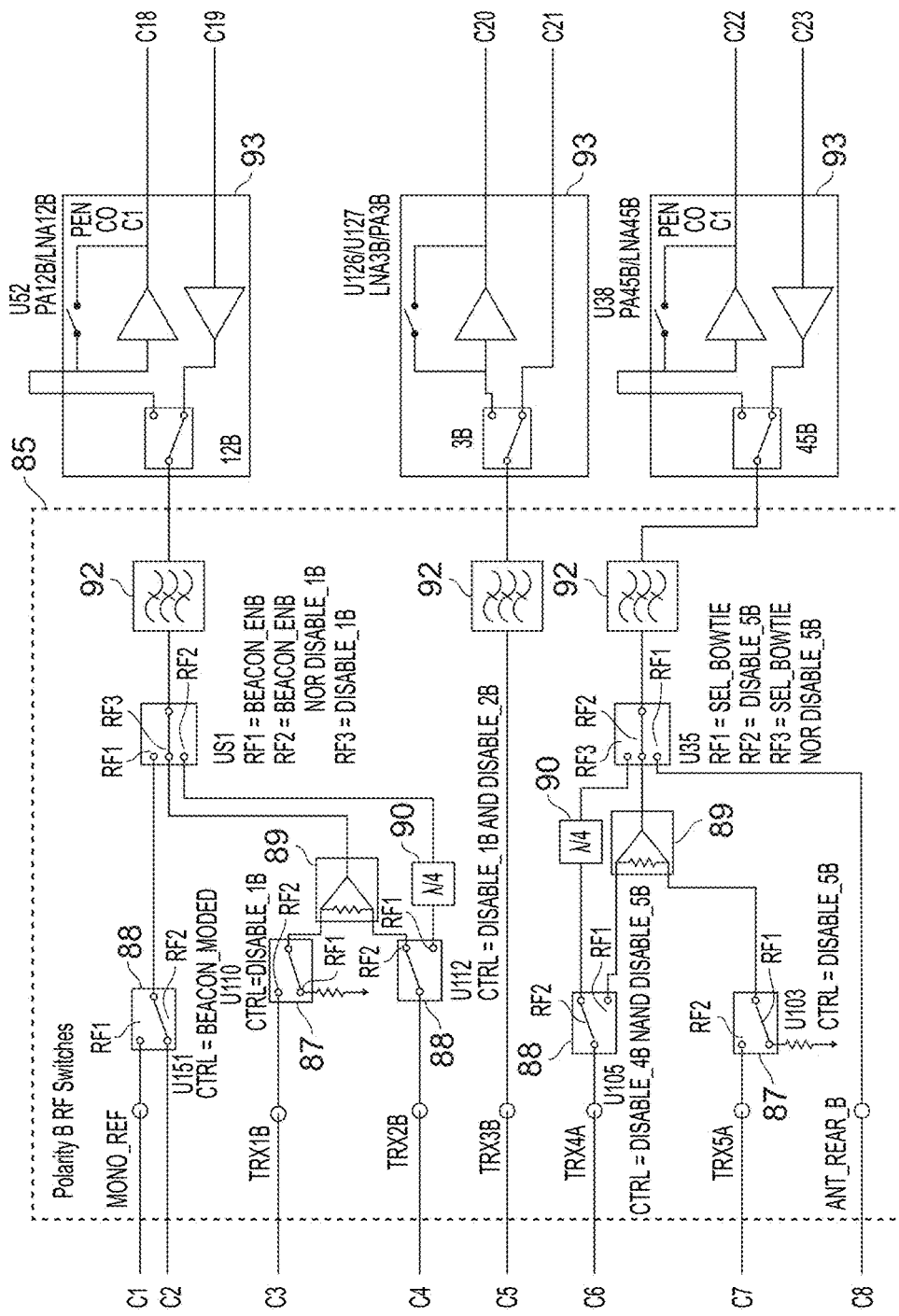
Figure 5B:
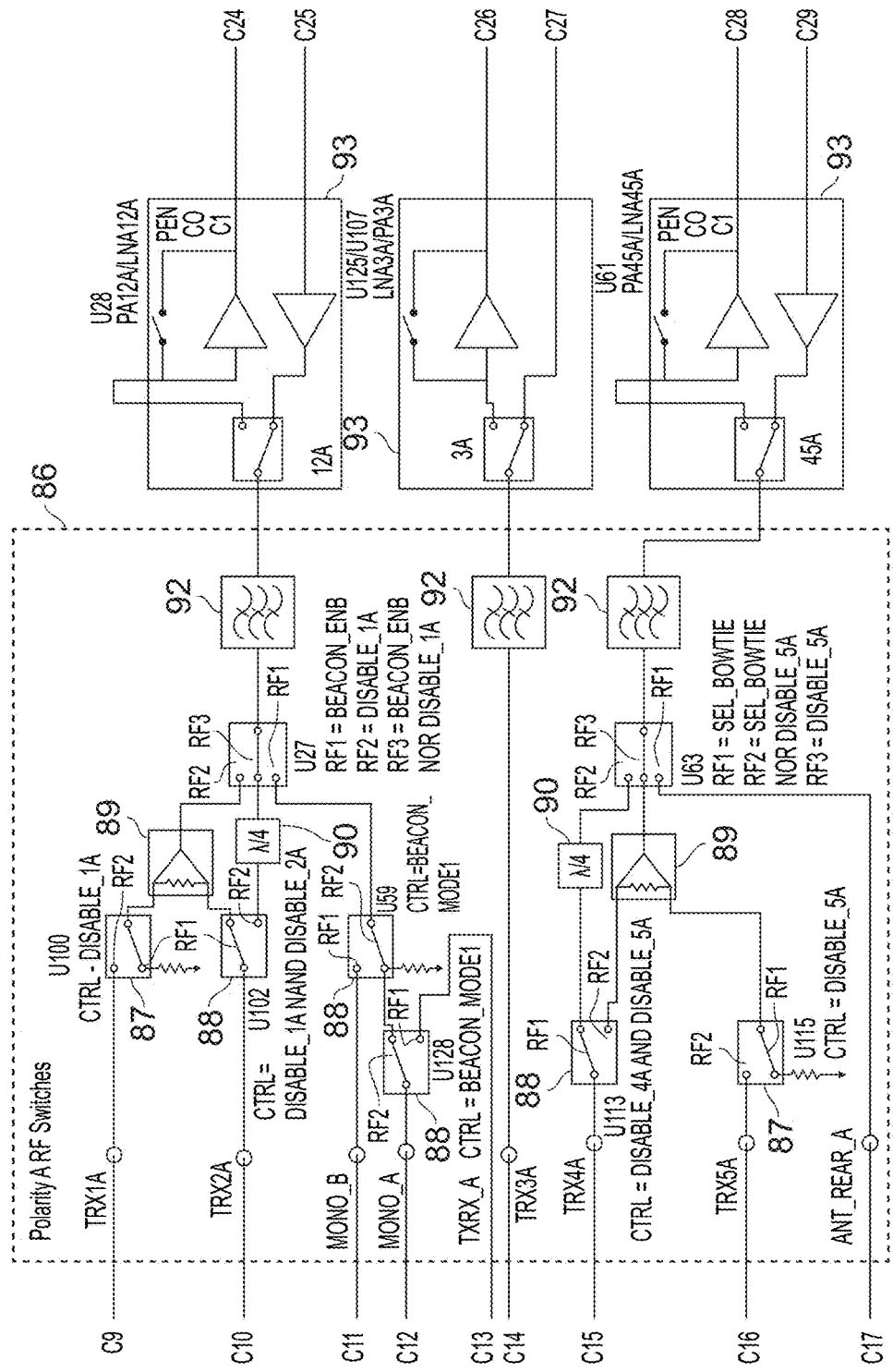
Figure 5C:
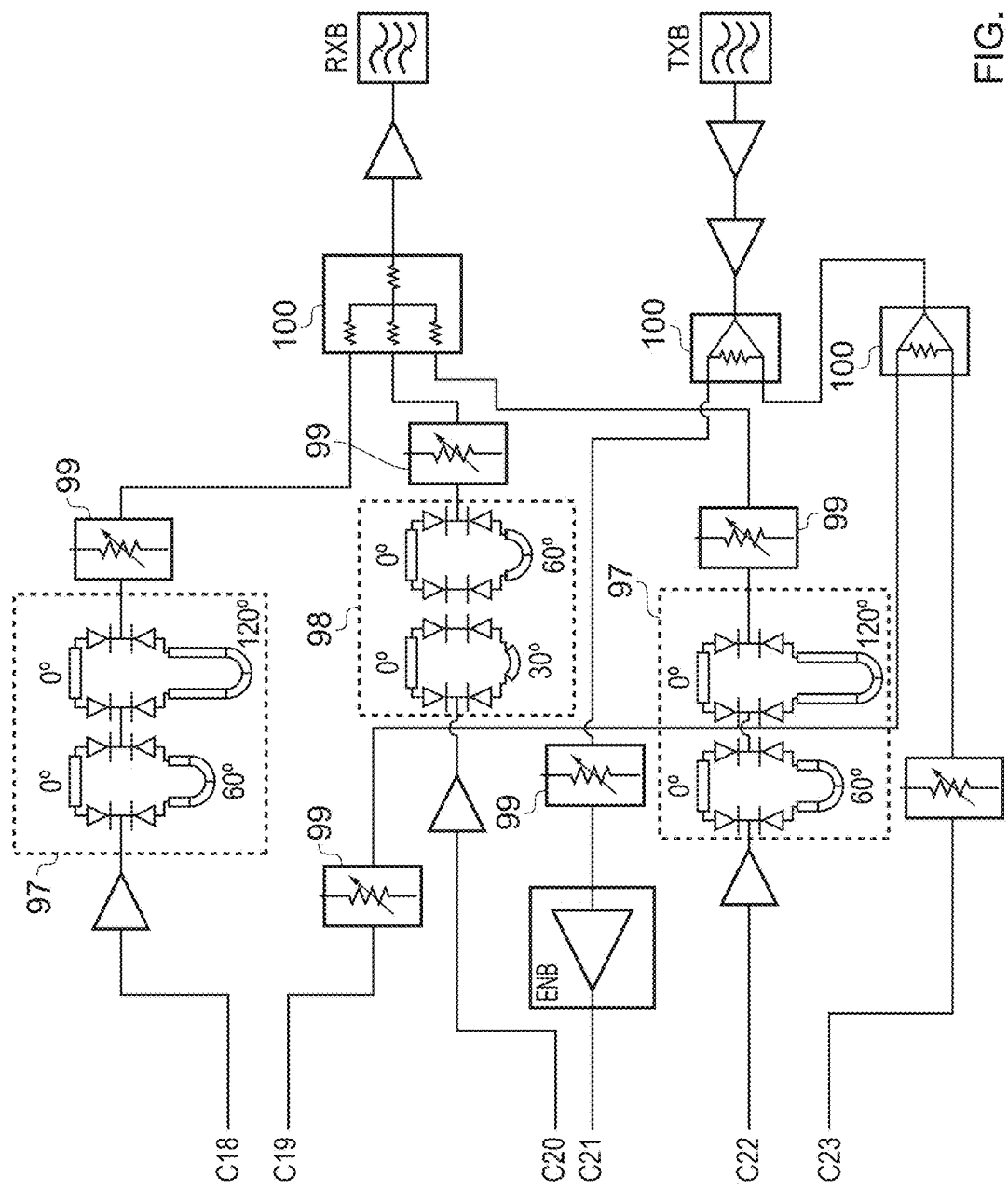
Figure 5C:
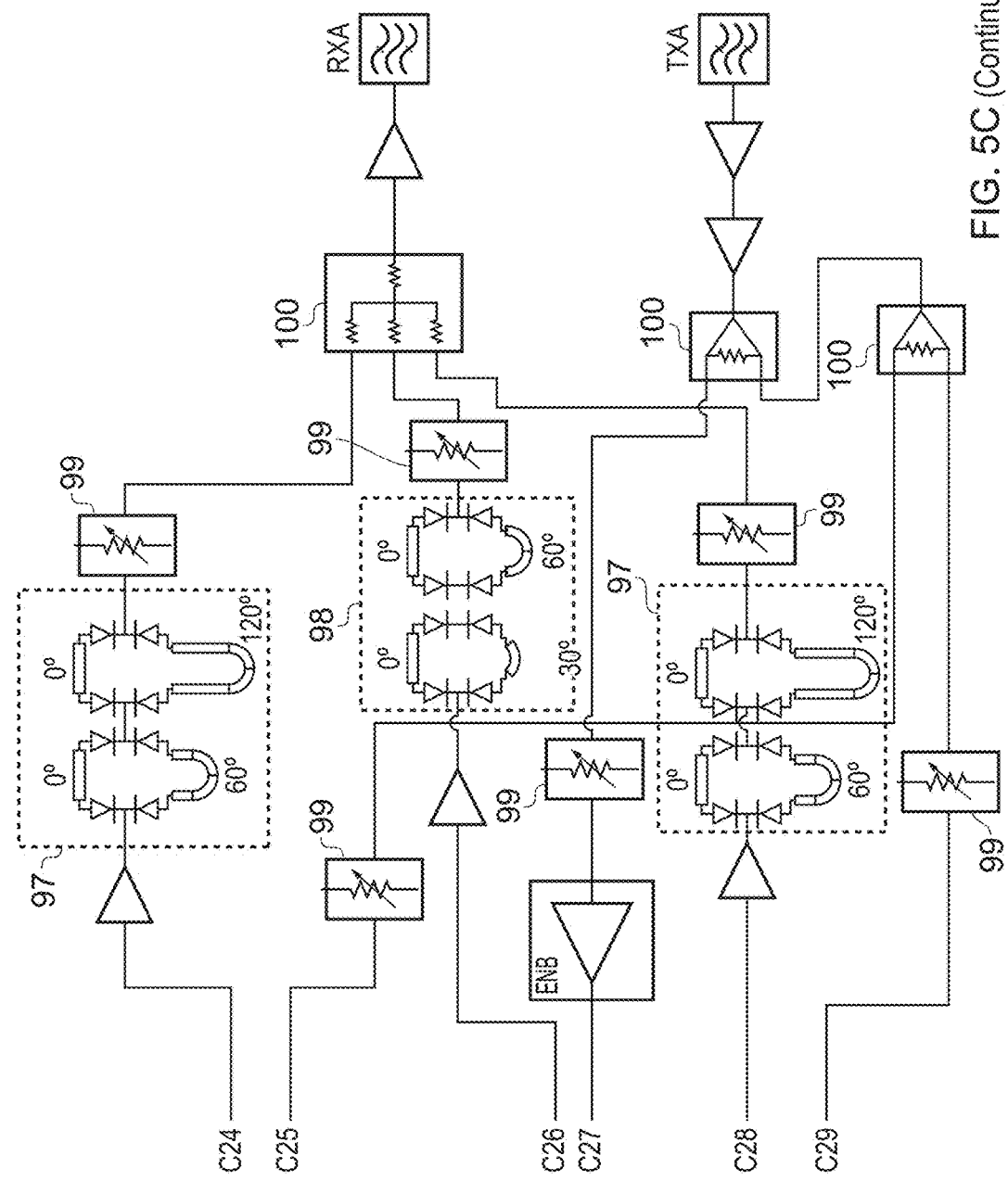

FIGS. 5A-C schematically illustrates the manner in which the RF chains are configured in one embodiment such as that illustrated in FIG. 4. The schematic is split across three sub-figures merely for clarity of illustration. The connections C1-C29 are purely a feature of this manner of illustration, showing how the respective connections continue from one sub-figure to the next. The patch antenna array elements of the front directional antenna are illustrated by the 5×5 set of squares 80 in FIG. 5A. On the left next to these are shown a column of patch elements 82, forming the rear facing antenna. Lower down in FIG. 5A, three antenna array elements 84 are shown, which provide the circular antenna. Turning to FIG. 5B, the nearest components to the array elements are the sets of first and second (A and B) polarity switches 85 and 86. These couple the RF chains to the lower edge (A) of the 5×5 array of patch elements and to its upper edge (B). Two orthogonally polarized signals can thus be applied to all elements of the 5×5 array of patch elements. Note that these sets of polarity switches 85 and 86 also comprise selection switches which either select between the corresponding antenna array component or a terminated input in the case of the selection switches 87, or select between two different possible connection paths for the corresponding array components in the case of selection switches 88. Accordingly, whilst the switching circuitry 88 simply enables certain antenna array components to be enabled or not, the switching circuitry 88 can be seen to provide sharing between the antenna array components for the elements of the RF chain which follow it. Certain pairs of connection paths are paired and feed into the two inputs of summation circuitry 89, which therefore enables both antenna array components to which the summation circuitry 89 may be connected (if both incidences of the switching circuitry 87 and 88 are so set) to be active and summed by the summation circuitry 89. Alternative selectable paths are also provided via the quarter wave-length (λ/4) shifters 90.

Proceeding rightwards in FIG. 5B, the signal 92 thus selected is provided to the set of direction selection circuitry 93 which enables switching between receiver and transmitter modes, only allowing signal transfer in one direction, by virtue of the selection between two directional paths. Thereafter, continuing rightwards to FIG. 5C, each RF chain comprises, for the receiver path, phase shifting circuitry 97 or 98. Each phase shifting circuitry comprises 4 fixed length phase paths which can be selectively engaged to enable phase shifts of 0°, 60°, 120° or 180° in the case of phase shifting circuitry 96, or phase shifts of 0°, 30°, 60°, or 90° in the case of phase shifting circuitry 98. This enables phase ramps of +/−60°, +/−30° and 0° to be applied across the array. FIG. 5C also shows gain circuitry 99, which is provided for each RF chain, both in the transmitter and receiver direction. Variability in the gain applied by these gain stages firstly allows a normalisation in gain variation between the columns (measured and calibrated during manufacture) and secondly, in the case of the central column, the variable gain is advantageous in allowing a fine tuning of main-lobe beam-width and hence adjacent null positions. Finally, each RF chain comprises summation circuitry 100 which enables further sharing of the RF chains.

It will be appreciated from the illustration of FIGS. 5A-C therefore that the sharing of the RF chains enables components of the RF electronics to be shared between the antenna (front, rear and circular) components, enabling a reduced size of RF electronics and cost thereof, in particular due to the shared phase shifting circuitry, such that not only is an antenna apparatus which is cheaper provided, but also one in which the RF electronics can be easily comprised within the portion of the antenna which rotates, and thus in close proximity to the antenna array components. Not only does this improve signal fidelity, it also facilitates the physical rotation of the antennas.

Note also from FIGS. 5A-C that independent RF chains are provided for each polarization allowing the signals transmitted and received by the front and rear antenna to be ±45° polarized, giving two polarizations, where each polarization carries a complex I/Q modulated signal. Note that these orthogonal polarizations are used to carry two streams of MIMO (multiple-in, multiple-out) encoded data, in a manner with which one of ordinary skill in the art will be familiar. It should be noted that the RF feed network could be routed to either edge (top or side) of the array, but merely for physical layout reasons of the particular embodiment shown here, the top/bottom design has been chosen. Various orthogonal polarizations may be employed, just three examples being: +/−45°, vertical/horizontal, and right-hand and left-hand circular polarization. Finally, note that certain combinations of antenna array components cannot be activated simultaneously. This allows further reduction in the number of RF chain components that must be provided by sharing RF chains between these components, yet the present techniques have nevertheless found that a useful range of beam patterns can be provided as will be discussed in some more detail below.

Figure 6:
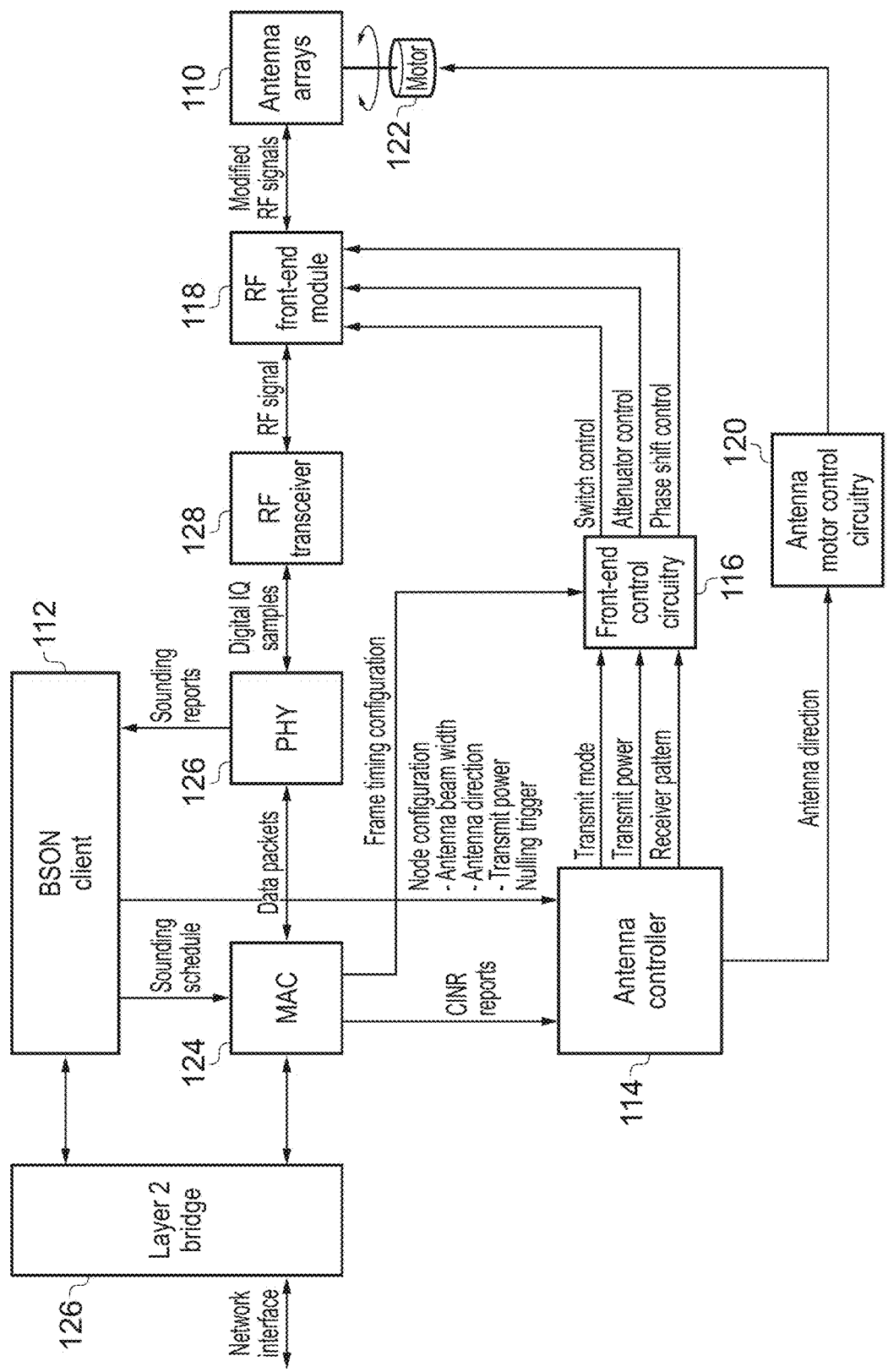
FIG. 6 schematically illustrates control circuitry and signal processing circuitry which are connected to the antenna arrays of one embodiment, both within the antenna apparatus itself and in other network components to which it is connected.

FIG. 6 schematically illustrates the connections of the antenna arrays (front, rear and circular) 110 in one embodiment. The antenna arrays 110 are controlled by some of the other components shown in FIG. 6. A backhaul self-organising network (BSON) client 112 (software running in the same housing as the antenna apparatus) provides node configuration including antenna beam width and direction, and transmit power and a nulling trigger to an antenna controller 114. This BSON client communicates with an external BSON server (not shown in this figure). However, additionally the antenna controller 114 may autonomously select the receiver pattern which maximises throughput based on carrier to interface and noise ratio (CINR) measurements. The antenna controller 114 controls the antenna arrays by passing configuration information for the transmit mode, the transmit power and the receiver pattern to the front end circuitry 116. The front end control circuitry 116 converts these into the required switch control signals, gain control signals and phase shift control signals which are passed to the RF front end module 118. The RF front end module 118 represents the components of FIG. 6 in which the components other than the antenna array components in FIG. 5 are to be found. The antenna controller 114 also indicates an antenna direction to the antenna motor control circuitry 120, which controls the motor 122 in order to orientate the antenna arrays 110 in azimuth. A modem data path is provided comprising the MAC 124, the PHY 126 and the RF transceiver 128, which then couples to the RF front end module 118 in order to provide this with the RF signals which the RF chains modify before passing them to the antenna arrays 110. In other words, data packets are sent between the MAC 124 and the PHY 126, digital IQ samples are passed between the PHY 126 and the RF transceiver 128, and RF signals are exchanged between the RF transceiver 128 and the RF front end module 118. The BSON client 112 (BSON controller) also generates sounding schedules to be implemented by the antenna apparatus which are received by the MAC 124. The MAC 124, like the BSON client 112 communicates with a Layer 2 bridge 126 which is coupled to the network interface.

Figure 7:
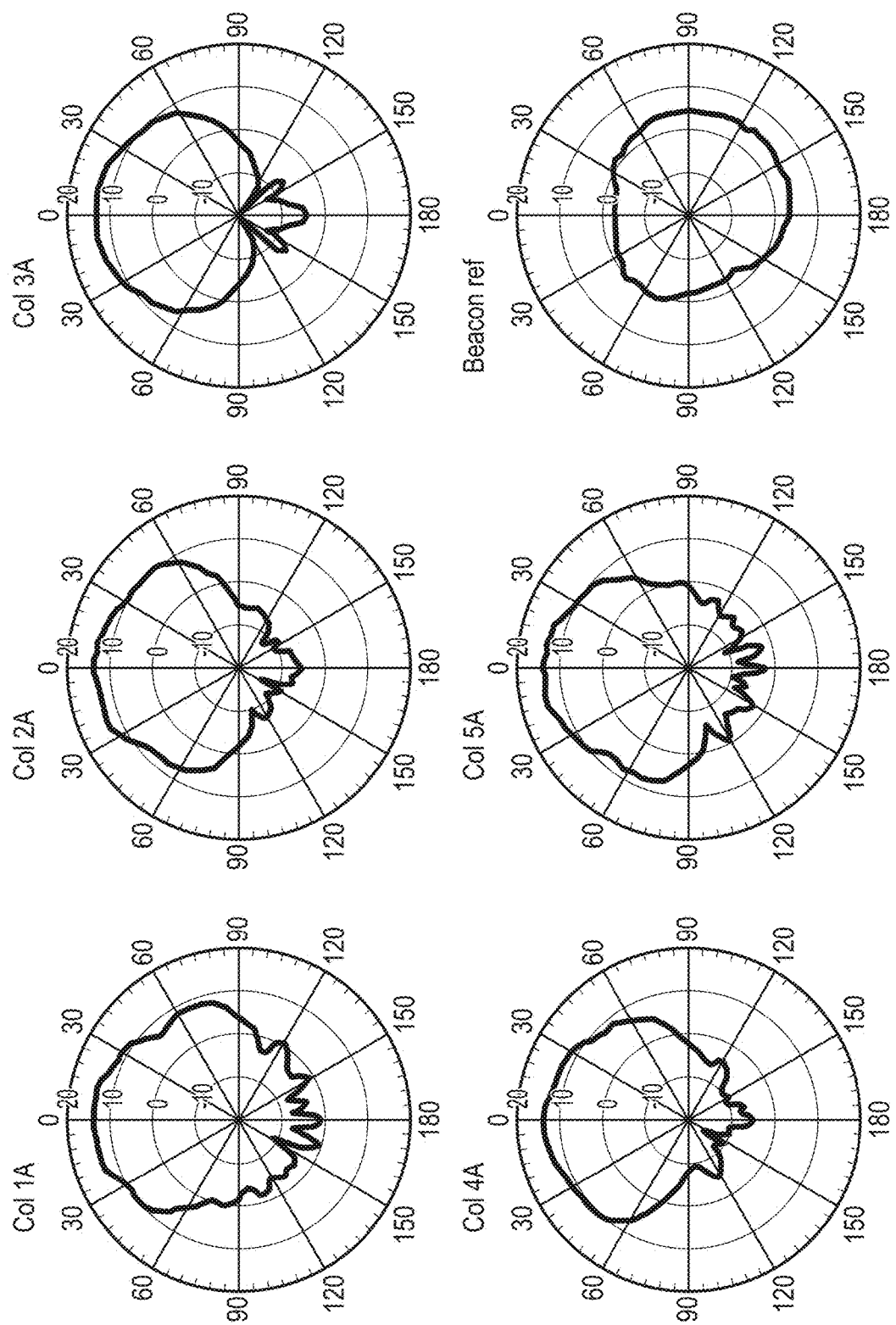
FIG. 7 shows a subset of the beam patterns which are available to an antenna apparatus in one embodiment.
Figure 7:
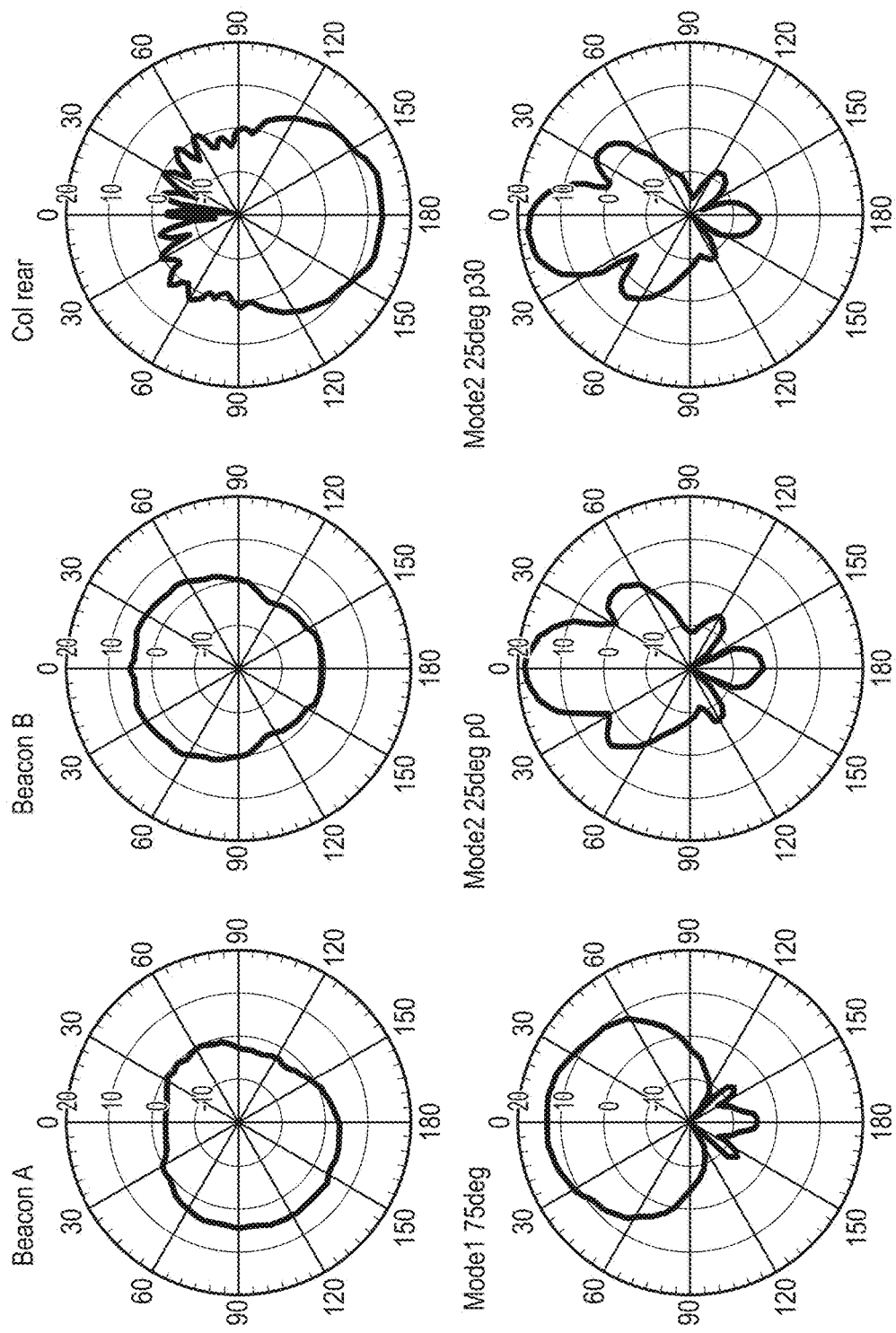
Figure 7:
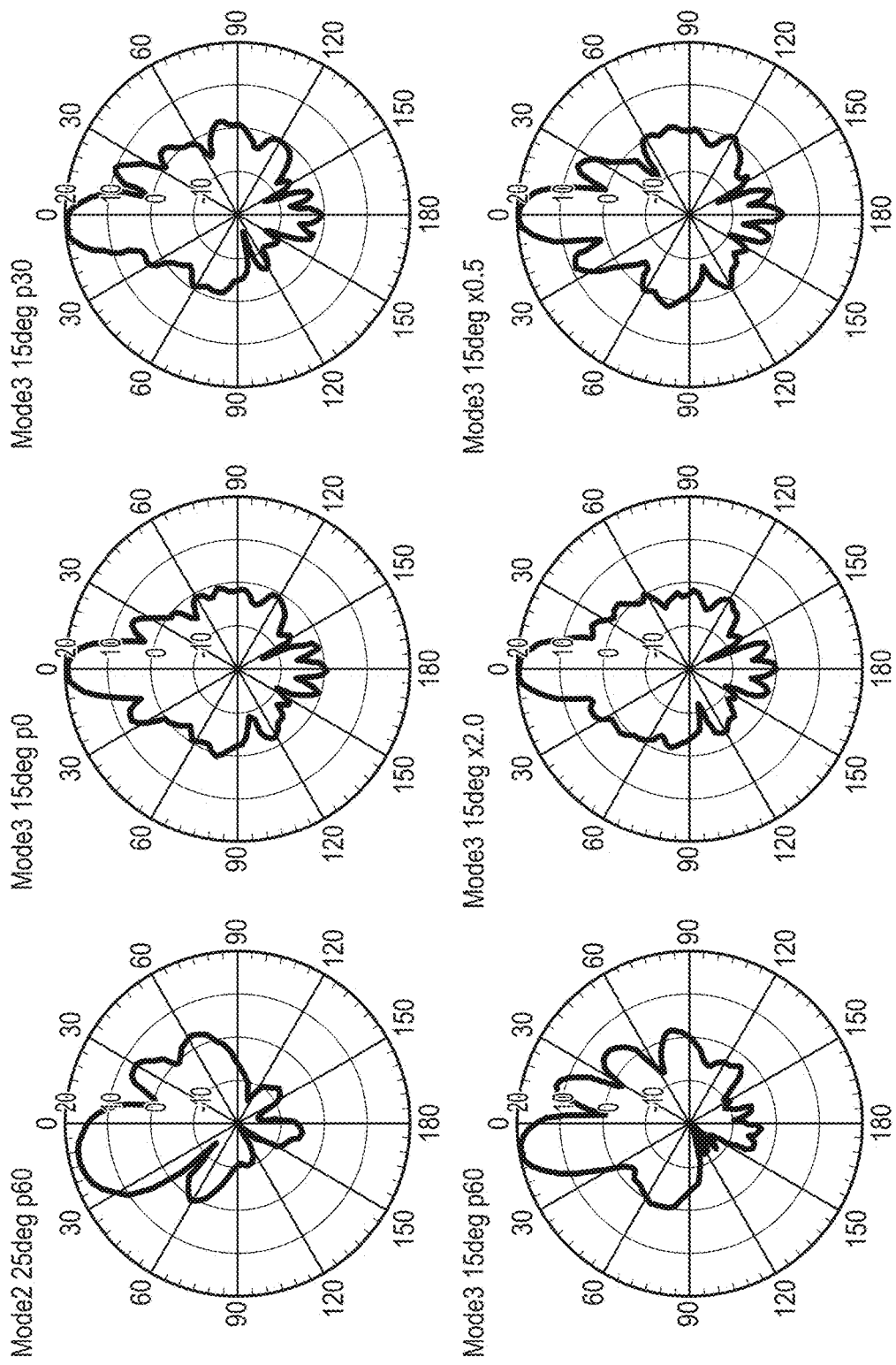
Figure 7:
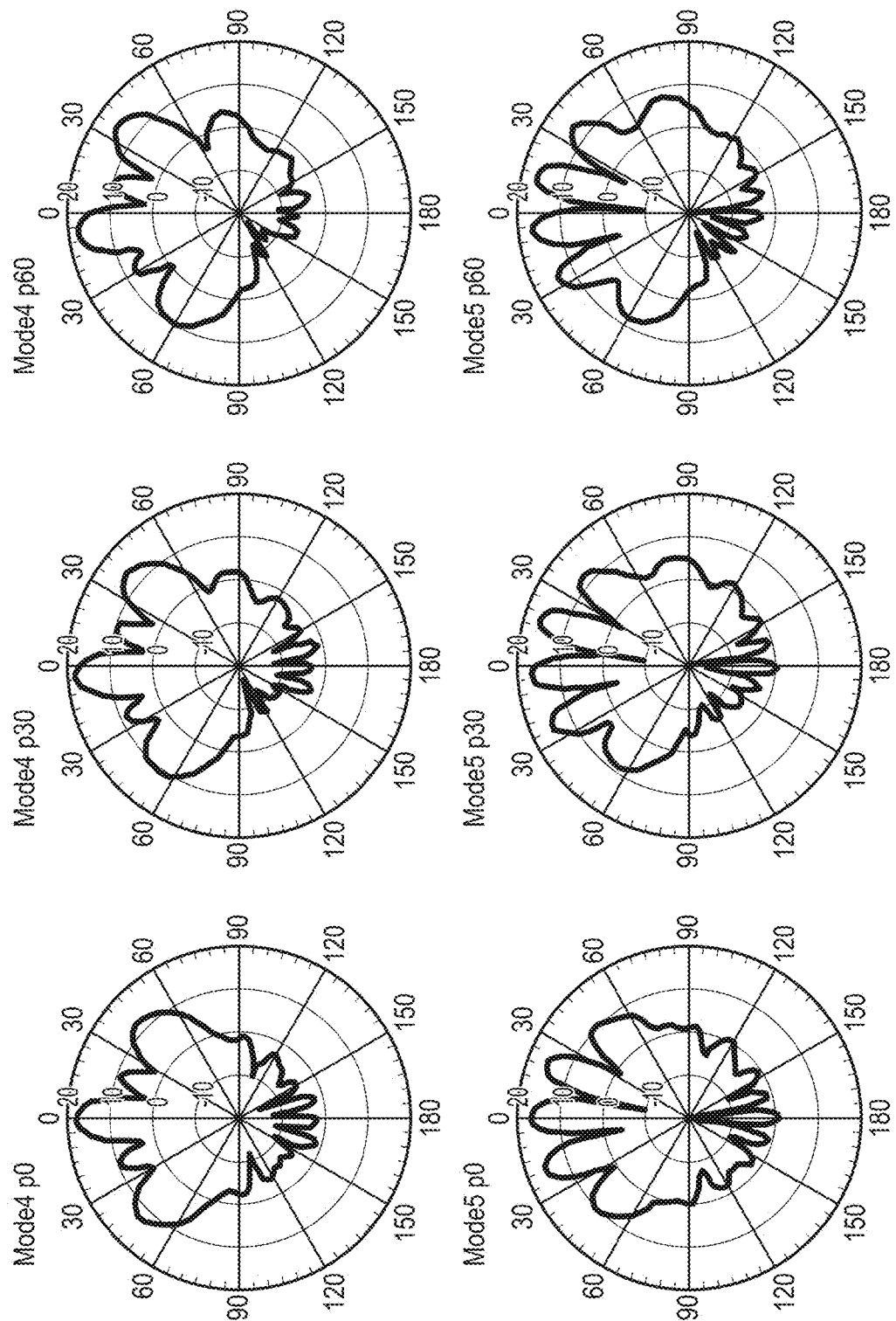
Figure 7:
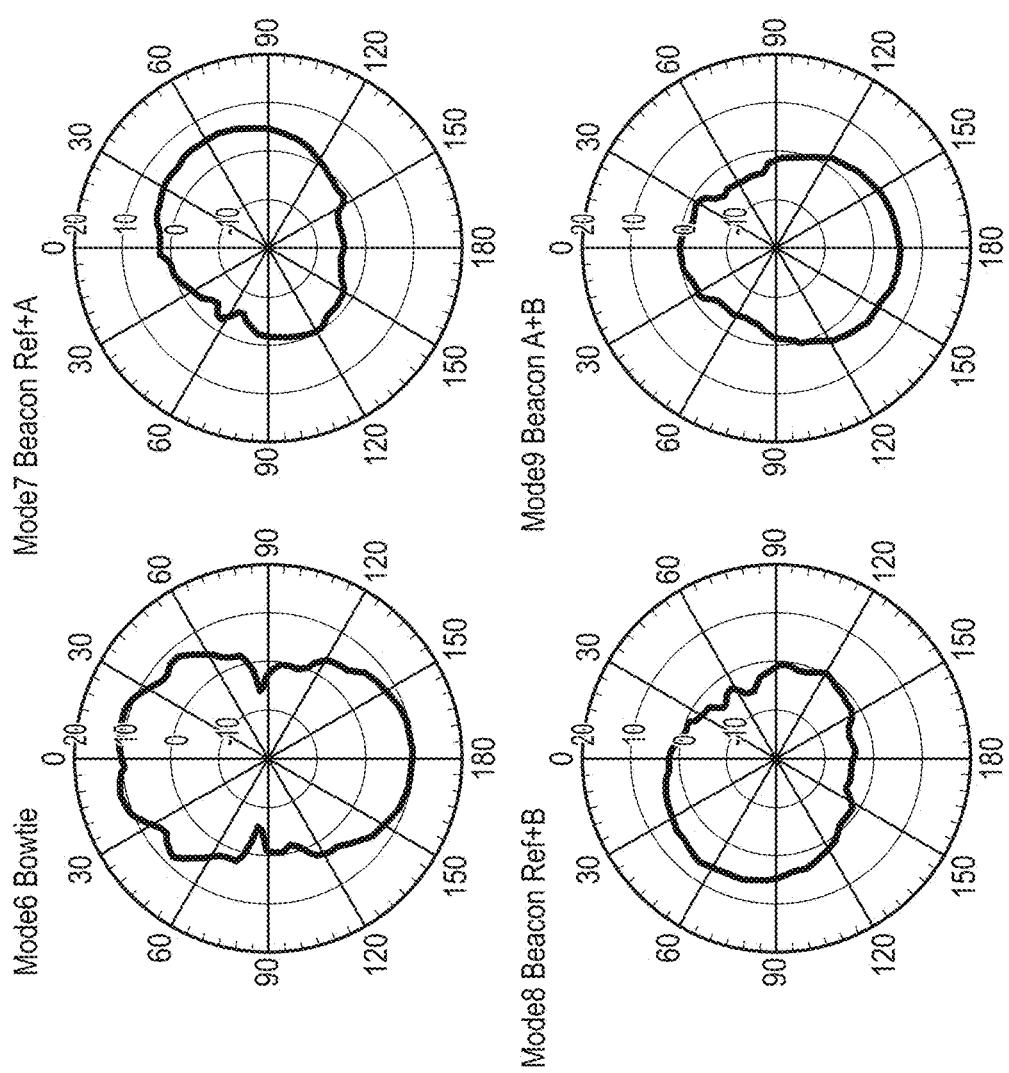

FIG. 7 shows a subset of the beam patterns which can be generated by an antenna array configured such as is illustrated in FIGS. 5 and 6, showing the useful range of beam patterns available. In FIG. 7 the following classes of beam patterns can be identified:

Narrow beams with a single main lobe and of various beam widths, where side lobes are significantly reduced relative to the main lobe;

Electronically steered beams that combine signals at RF, enabling antenna directivity to the left or right of the bore sight of the array;

Beams with grating lobes, where the array pattern has equally strong peaks in multiple directions and deep nulls with significant attenuation (gain <1) in other directions;

A bowtie configuration;

Three 'beacon' omni-directional patterns.

Combined with the above discussed rotating mechanism, the antenna apparatus thus provided, using a fixed set of beam patterns, improves over traditional uniform linear arrays, by being able to maintain a peak gain in any direction. For uniform linear arrays, it is known that the array gain decreases as the angle from the bore sight increases. In addition, the antenna apparatus provided is economically more attractive than more complex circular arrays. For example, ten complete transceiver chains with an aperture of 6.0λ, would generate an antenna pattern with 25° beam width. Embodiments of the antenna apparatus described herein have an aperture which is 4λ, and use only two transceiver chains (note that the RF chains shown in FIGS. 5A to 5C reduce down to two connections in the receiver direction and two connections in the transmitter direction) and the narrowest beam that can be generated is 15°. Overall therefore the antenna apparatus provided by the present techniques enables the maximum gain to be orientated in any direction in 360°, whilst improving diversity reception and conversely interference nulling from any direction using a rich set of multiple transmitter and receiver beams.

Figure 8:
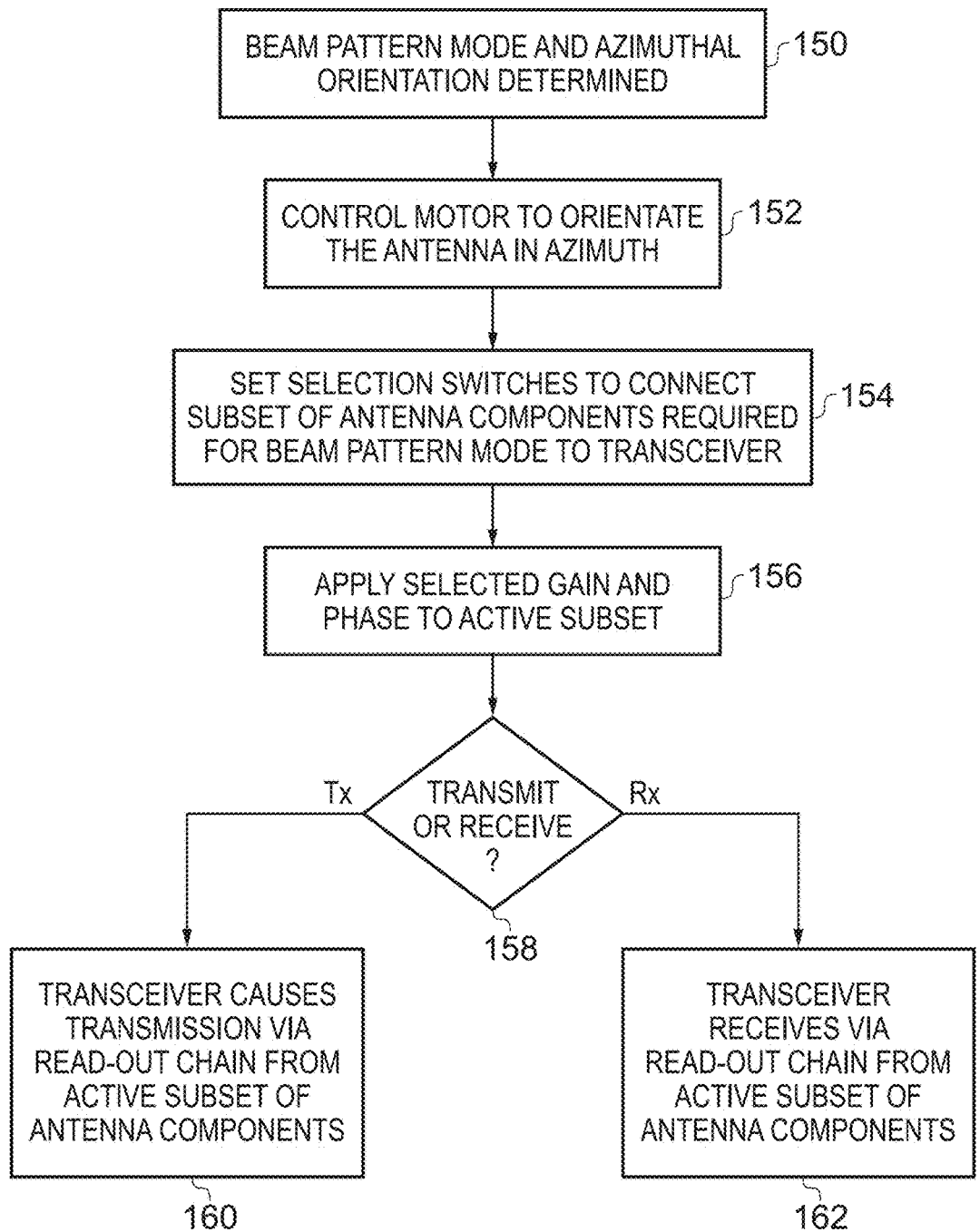
FIG. 8 shows a sequence of steps which are taken when operating an antenna apparatus in one embodiment.

FIG. 8 shows a sequence of steps which are taken in the method of one embodiment. At step 150 a beam pattern mode and azimuthal orientation are determined for the antenna apparatus and at step 152 the motor of the antenna apparatuses control orientates the antenna in azimuth. At step 154 the selection switches of the RF front end module are set to correctly connect a subset of the available antenna components required for the selected beam pattern and mode to the transceiver. Then at step 156 the selected gain and phase are supplied to this active subset by means of switching of the corresponding gain circuitry and phase circuitry in the front end electronics. Then finally, at step 158, if the antenna apparatus is being operated in transmission mode the flow proceeds to step 160 and the transceiver causes transmission via the RF chain from the active subset of antenna components, whereas if the antenna apparatus is being operated as a receiver, then the flow proceeds to step 162 where the transceiver receives via the RF chain from the active subset of antenna components.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. Antenna apparatus comprising:
    a directional antenna comprising a plurality of antenna array components;
    a plurality of RF chains connected to the plurality of antenna array components;
    a transceiver connected to the plurality of RF chains,
    wherein each RF chain comprises in sequence:
        a switching stage having switching circuitry selectively to connect an antenna array component;
        a phase shifting stage having phase shifting circuitry; and
        a summation stage having summation circuitry,
    wherein at least two of the RF chains connected to different antenna array components share phase shifting circuitry and at least two of the RF chains connected to different antenna array components share summation circuitry, and wherein the plurality of RF chains comprises a further summation stage having further summation circuitry, wherein the further summation stage is between the switching stage and the phase shifting stage, and the further summation stage is configured to combine output from two of the plurality of antenna array components to forward to the shared phase shifting circuitry.

2. The antenna apparatus as claimed in claim 1, wherein the plurality of RF chains comprises a gain stage having gain circuitry, wherein at least two of the RF chains connected to different antenna array components share gain circuitry.

3. The antenna apparatus as claimed in claim 2, wherein the gain circuitry of the gain stages is responsive to a gain control signal to select a fixed gain.

4. The antenna apparatus as claimed in claim 2, wherein the gain circuitry of the gain stages is responsive to a gain control signal to select a variable gain.

5. The antenna apparatus as claimed in claim 1, wherein the phase shifting circuitry of the phase shifting stages comprises a plurality of fixed length phase paths, and the phase circuitry comprises phase selection circuitry responsive to a phase selection signal to route the RF chain via one of the plurality of fixed length phase paths.

6. The antenna apparatus as claimed in claim 1, wherein the directional antenna is a uniform linear antenna array.

7. The antenna apparatus as claimed in claim 1, wherein the plurality of antenna array components comprises a plurality of antenna array elements arranged in columns to form the antenna array components.

8. The antenna apparatus as claimed in claim 7, wherein the antenna array elements at one end of the columns of antenna array elements are connected to a first RF chain which is independent of a second RF chain connected to the antenna array elements at an opposite end of the columns of antenna array elements.

9. The antenna apparatus as claimed in claim 1, further comprising a mounting portion configured to be fixed relative to a physical location of the antenna apparatus, wherein the directional antenna is configured to be rotatably positioned about an axis with respect to the mounting portion, and the plurality of RF chains is fixedly located with respect to the directional antenna.

10. The antenna apparatus as claimed in claim 9, wherein the plurality of RF chains is located behind the plurality of antenna array components.

11. The antenna apparatus as claimed in claim 1, further comprising:
   a rear directional antenna, wherein a rear RF chain of the plurality of RF chains is connected to the rear directional antenna and the rear RF chain is at least partially shared with a RF chain connected to an antenna array component of the plurality of antenna array components; and
   at least one RF chain comprises a further switching stage, wherein the further switching stage is configured to selectively connect only one of: the antenna array component and the rear directional antenna to the at least partially shared RF chain.

12. The antenna apparatus as claimed in claim 11, wherein the rear directional antenna is fixedly mounted with respect to the directional antenna, wherein the rear directional antenna is oriented in a substantially opposite direction to the directional antenna, and wherein the plurality of RF chains are located between the directional antenna and the rear directional antenna.

13. The antenna apparatus as claimed in claim 11, wherein the rear directional antenna is a rear uniform linear antenna array.

14. The antenna apparatus as claimed in claim 1, further comprising:
   a uniform circular antenna array comprising a plurality of circular antenna array components, wherein a uniform circular antenna RF chain of the plurality of RF chains is connected to a uniform circular antenna array component and the uniform circular antenna RF chain is at least partially shared with a RF chain connected to an antenna array component of the plurality of antenna array components; and
   at least one RF chain comprises a further switching stage, wherein the further switching stage is configured to selectively connect only one of: the antenna array component and the uniform circular antenna array component to the at least partially shared RF chain.

15. The antenna apparatus as claimed in claim 14, comprising control circuitry to time-multiplex operation of the uniform circular antenna array and the directional antenna.

16. The antenna apparatus as claimed in claim 1, further comprising beam pattern control circuitry to control activation, gain and phase of the antenna or antennas of the antenna apparatus such that the antenna apparatus is operated in a selected mode with a selected beam pattern of a set of beam patterns, wherein the set of beam patterns provides a range of directionality and interference nulling.

17. The antenna apparatus as claimed in claim 16, wherein the beam pattern control circuitry is responsive to an instruction received from a wireless network controller for a wireless network comprising more than one antenna apparatus to cause the antenna apparatus to be operated in the selected mode with the selected beam pattern.

18. The antenna apparatus as claimed in claim 16, wherein the beam pattern control circuitry is responsive to a configuration determined in the antenna apparatus to cause the antenna apparatus to be operated in the selected mode with the selected beam pattern.

19. The antenna apparatus as claimed in claim 16, wherein the selected mode and beam pattern are used to operate the antenna apparatus in a point-to-point mode in a wireless network.

20. The antenna apparatus as claimed in claim 16, wherein the selected mode and beam pattern are used to operate the antenna apparatus in a point to multi-point mode in a wireless network.

21. A method of operating an antenna apparatus comprising the steps of:
   connecting a plurality of antenna array components via a plurality of RF chains to a transceiver, wherein at least two of the RF chains connected to different antenna array components share phase shifting circuitry and at least two of the RF chains connected to different antenna array components share summation circuitry; and
   in forward or reverse sequence in at least one RF chain:
   selectively connecting an antenna array component to a shared RF chain;
   phase shifting using a shared phase shifting stage of the shared RF chain;
   summing using a shared summation stage of the shared RF chain; and
   in the plurality of RF chains, further summing between the selectively connecting and the phase shifting, and the further summing combines output from two RF chains of the plurality of antenna array components to forward to the shared phase shifting stage.

22. Antenna apparatus comprising:
   means for directionally transmitting and receiving wireless signals comprising a plurality of antenna array components;
   means for providing a plurality of RF chains to connected the plurality of antenna array components to a transceiver;
   means for transceiving signals carried by the plurality of RF chains,
   wherein each RF chain comprises in sequence:
      means for selectively disconnecting an antenna array component;
      means for phase shifting; and
      means for summing,
   wherein at least two of the RF chains connected to different antenna array components share the means for phase shifting and at least two of the RF chains connected to different antenna array components share the means for summing, wherein:
      the means for providing a plurality of RF chains comprises a further 20 means for summation, wherein the further means for summation is between the means for selectively disconnecting and the means for phase shifting, and the further means for summation for combining output from two of the plurality of antenna array components to forward to the shared means for phase shifting.

* * * * *